(12) United States Patent
Clark et al.

(10) Patent No.: US 9,154,123 B1
(45) Date of Patent: Oct. 6, 2015

(54) BODY BIAS CIRCUITS AND METHODS

(71) Applicant: MIE Fujitsu Semiconductor Limited, Kuwana (JP)

(72) Inventors: Lawrence T. Clark, Phoenix, AZ (US); Michael S. McGregor, Morgan Hill, CA (US); Robert Rogenmoser, Schwerzenbach (CH); David A. Kidd, San Jose, CA (US); Augustine Kuo, Berkeley, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/463,399

(22) Filed: Aug. 19, 2014

Related U.S. Application Data

(62) Division of application No. 13/668,063, filed on Nov. 2, 2012, now Pat. No. 8,816,754.

(51) Int. Cl.
*H03K 3/01* (2006.01)
*H03K 17/14* (2006.01)

(52) U.S. Cl.
CPC .................... *H03K 17/145* (2013.01)

(58) Field of Classification Search
CPC ........... G01R 31/2621; G01R 31/2625; G01R 31/2628; H01L 22/34
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |

(Continued)

FOREIGN PATENT DOCUMENTS

EP  0274278 A1  7/1988
EP  0312237 A2  4/1989

(Continued)

OTHER PUBLICATIONS

English Translation of JP 8153873 Submitted herewith.

(Continued)

*Primary Examiner* — Jeffrey Zweizig
(74) *Attorney, Agent, or Firm* — Baker Botts L.L.P.

(57) ABSTRACT

An integrated circuit can include a plurality of drive monitoring sections, each including at least one transistor under test (TUT) having a source coupled to a first power supply node, a gate coupled to receive a start indication, and a drain coupled to a monitor node, at least one monitor capacitor coupled to the monitor node, and a timing circuit configured to generate a monitor value corresponding to a rate at which the TUT can transfer current between the monitor node and the first power supply node; and a body bias circuit configured to apply a body bias voltage to at least one body region in which at least one transistor is formed; wherein the body bias voltage is generated in response to at least a plurality of the monitor values.

16 Claims, 12 Drawing Sheets

(56) References Cited

U.S. PATENT DOCUMENTS

| | | | |
|---|---|---|---|
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,342,790 B1 * | 1/2002 | Ferguson et al. ........ 324/762.02 |
| 6,348,806 B1 * | 2/2002 | Okandan et al. ........... 324/750.3 |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,456,104 B1 | 9/2002 | Guarin et al. |
| 6,461,920 B1 | 10/2002 | Shirahata et al. |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |

(56) References Cited

U.S. PATENT DOCUMENTS

| | | | |
|---|---|---|---|
| 6,831,292 | B2 | 12/2004 | Currie et al. |
| 6,835,639 | B2 | 12/2004 | Rotondaro et al. |
| 6,852,602 | B2 | 2/2005 | Kanzawa et al. |
| 6,852,603 | B2 | 2/2005 | Chakravarthi et al. |
| 6,881,641 | B2 | 4/2005 | Wieczorek et al. |
| 6,881,987 | B2 | 4/2005 | Sohn |
| 6,891,439 | B2 | 5/2005 | Jaehne et al. |
| 6,893,947 | B2 | 5/2005 | Martinez et al. |
| 6,900,519 | B2 | 5/2005 | Cantell et al. |
| 6,901,564 | B2 | 5/2005 | Stine et al. |
| 6,916,698 | B2 | 7/2005 | Mocuta et al. |
| 6,917,237 | B1 | 7/2005 | Tschanz et al. |
| 6,927,463 | B2 | 8/2005 | Iwata et al. |
| 6,928,128 | B1 | 8/2005 | Sidiropoulos |
| 6,930,007 | B2 | 8/2005 | Bu et al. |
| 6,930,360 | B2 | 8/2005 | Yamauchi et al. |
| 6,957,163 | B2 | 10/2005 | Ando |
| 6,963,090 | B2 | 11/2005 | Passlack et al. |
| 6,995,397 | B2 | 2/2006 | Yamashita et al. |
| 7,002,214 | B1 | 2/2006 | Boyd et al. |
| 7,008,836 | B2 | 3/2006 | Algotsson et al. |
| 7,013,359 | B1 | 3/2006 | Li |
| 7,015,546 | B2 | 3/2006 | Herr et al. |
| 7,015,741 | B2 | 3/2006 | Tschanz et al. |
| 7,022,559 | B2 | 4/2006 | Barnak et al. |
| 7,036,098 | B2 | 4/2006 | Eleyan et al. |
| 7,038,258 | B2 | 5/2006 | Liu et al. |
| 7,039,881 | B2 | 5/2006 | Regan |
| 7,045,456 | B2 | 5/2006 | Murto et al. |
| 7,057,216 | B2 | 6/2006 | Ouyang et al. |
| 7,061,058 | B2 | 6/2006 | Chakravarthi et al. |
| 7,064,039 | B2 | 6/2006 | Liu |
| 7,064,399 | B2 | 6/2006 | Babcock et al. |
| 7,071,103 | B2 | 7/2006 | Chan et al. |
| 7,078,325 | B2 | 7/2006 | Curello et al. |
| 7,078,776 | B2 | 7/2006 | Nishinohara et al. |
| 7,089,513 | B2 | 8/2006 | Bard et al. |
| 7,089,515 | B2 | 8/2006 | Hanafi et al. |
| 7,091,093 | B1 | 8/2006 | Noda et al. |
| 7,103,861 | B2 | 9/2006 | Ang et al. |
| 7,105,399 | B1 | 9/2006 | Dakshina-Murthy et al. |
| 7,109,099 | B2 | 9/2006 | Tan et al. |
| 7,119,381 | B2 | 10/2006 | Passlack |
| 7,122,411 | B2 | 10/2006 | Mouli |
| 7,127,687 | B1 | 10/2006 | Signore |
| 7,132,323 | B2 | 11/2006 | Haensch et al. |
| 7,161,401 | B2 | 1/2007 | Li |
| 7,169,675 | B2 | 1/2007 | Tan et al. |
| 7,170,120 | B2 | 1/2007 | Datta et al. |
| 7,176,137 | B2 | 2/2007 | Perng et al. |
| 7,186,598 | B2 | 3/2007 | Yamauchi et al. |
| 7,189,627 | B2 | 3/2007 | Wu et al. |
| 7,199,430 | B2 | 4/2007 | Babcock et al. |
| 7,202,517 | B2 | 4/2007 | Dixit et al. |
| 7,208,354 | B2 | 4/2007 | Bauer |
| 7,211,871 | B2 | 5/2007 | Cho |
| 7,221,021 | B2 | 5/2007 | Wu et al. |
| 7,223,646 | B2 | 5/2007 | Miyashita et al. |
| 7,226,833 | B2 | 6/2007 | White et al. |
| 7,226,843 | B2 | 6/2007 | Weber et al. |
| 7,230,680 | B2 | 6/2007 | Fujisawa et al. |
| 7,235,822 | B2 | 6/2007 | Li |
| 7,256,639 | B1 | 8/2007 | Koniaris et al. |
| 7,259,428 | B2 | 8/2007 | Inaba |
| 7,260,562 | B2 | 8/2007 | Czajkowski et al. |
| 7,294,877 | B2 | 11/2007 | Rueckes et al. |
| 7,297,994 | B2 | 11/2007 | Wieczorek et al. |
| 7,301,208 | B2 | 11/2007 | Handa et al. |
| 7,304,350 | B2 | 12/2007 | Misaki |
| 7,307,471 | B2 | 12/2007 | Gammie et al. |
| 7,312,500 | B2 | 12/2007 | Miyashita et al. |
| 7,321,254 | B2 | 1/2008 | Li et al. |
| 7,323,754 | B2 | 1/2008 | Ema et al. |
| 7,332,439 | B2 | 2/2008 | Lindert et al. |
| 7,336,088 | B2 * | 2/2008 | Rius Vazquez et al. .... 324/750.3 |
| 7,348,629 | B2 | 3/2008 | Chu et al. |
| 7,354,833 | B2 | 4/2008 | Liaw |
| 7,380,225 | B2 | 5/2008 | Joshi et al. |
| 7,398,497 | B2 | 7/2008 | Sato et al. |
| 7,402,207 | B1 | 7/2008 | Besser et al. |
| 7,402,872 | B2 | 7/2008 | Murthy et al. |
| 7,416,605 | B2 | 8/2008 | Zollner et al. |
| 7,427,788 | B2 | 9/2008 | Li et al. |
| 7,442,971 | B2 | 10/2008 | Wirbeleit et al. |
| 7,449,733 | B2 | 11/2008 | Inaba et al. |
| 7,462,908 | B2 | 12/2008 | Bol et al. |
| 7,469,164 | B2 | 12/2008 | Du-Nour |
| 7,470,593 | B2 | 12/2008 | Rouh et al. |
| 7,485,536 | B2 | 2/2009 | Jin et al. |
| 7,487,474 | B2 | 2/2009 | Ciplickas et al. |
| 7,491,988 | B2 | 2/2009 | Tolchinsky et al. |
| 7,494,861 | B2 | 2/2009 | Chu et al. |
| 7,496,862 | B2 | 2/2009 | Chang et al. |
| 7,496,867 | B2 | 2/2009 | Turner et al. |
| 7,498,637 | B2 | 3/2009 | Yamaoka et al. |
| 7,501,324 | B2 | 3/2009 | Babcock et al. |
| 7,501,880 | B2 | 3/2009 | Bonaccio et al. |
| 7,503,020 | B2 | 3/2009 | Allen et al. |
| 7,504,876 | B1 | 3/2009 | Raghavan et al. |
| 7,507,999 | B2 | 3/2009 | Kusumoto et al. |
| 7,514,766 | B2 | 4/2009 | Yoshida |
| 7,521,323 | B2 | 4/2009 | Surdeanu et al. |
| 7,531,393 | B2 | 5/2009 | Doyle et al. |
| 7,531,836 | B2 | 5/2009 | Liu et al. |
| 7,538,364 | B2 | 5/2009 | Twynam |
| 7,538,412 | B2 | 5/2009 | Schulze et al. |
| 7,562,233 | B1 | 7/2009 | Sheng et al. |
| 7,564,105 | B2 | 7/2009 | Chi et al. |
| 7,566,600 | B2 | 7/2009 | Mouli |
| 7,569,456 | B2 | 8/2009 | Ko et al. |
| 7,586,322 | B1 | 9/2009 | Xu et al. |
| 7,592,241 | B2 | 9/2009 | Takao |
| 7,595,243 | B1 | 9/2009 | Bulucea et al. |
| 7,598,142 | B2 | 10/2009 | Ranade et al. |
| 7,605,041 | B2 | 10/2009 | Ema et al. |
| 7,605,060 | B2 | 10/2009 | Meunier-Beillard et al. |
| 7,605,429 | B2 | 10/2009 | Bernstein et al. |
| 7,608,496 | B2 | 10/2009 | Chu |
| 7,615,802 | B2 | 11/2009 | Elpelt et al. |
| 7,622,341 | B2 | 11/2009 | Chudzik et al. |
| 7,638,380 | B2 | 12/2009 | Pearce |
| 7,642,140 | B2 | 1/2010 | Bae et al. |
| 7,644,377 | B1 | 1/2010 | Saxe et al. |
| 7,645,665 | B2 | 1/2010 | Kubo et al. |
| 7,651,920 | B2 | 1/2010 | Siprak |
| 7,655,523 | B2 | 2/2010 | Babcock et al. |
| 7,659,772 | B2 | 2/2010 | Nomura et al. |
| 7,673,273 | B2 | 3/2010 | Madurawae et al. |
| 7,675,126 | B2 | 3/2010 | Cho |
| 7,675,317 | B2 | 3/2010 | Perisetty |
| 7,678,638 | B2 | 3/2010 | Chu et al. |
| 7,681,628 | B2 | 3/2010 | Joshi et al. |
| 7,682,887 | B2 | 3/2010 | Dokumaci et al. |
| 7,683,442 | B1 | 3/2010 | Burr et al. |
| 7,696,000 | B2 | 4/2010 | Liu et al. |
| 7,704,822 | B2 | 4/2010 | Jeong |
| 7,704,844 | B2 | 4/2010 | Zhu et al. |
| 7,709,828 | B2 | 5/2010 | Braithwaite et al. |
| 7,723,750 | B2 | 5/2010 | Zhu et al. |
| 7,737,472 | B2 | 6/2010 | Kondo et al. |
| 7,741,138 | B2 | 6/2010 | Cho |
| 7,741,200 | B2 | 6/2010 | Cho et al. |
| 7,745,270 | B2 | 6/2010 | Shah et al. |
| 7,750,374 | B2 | 7/2010 | Capasso et al. |
| 7,750,381 | B2 | 7/2010 | Hokazono et al. |
| 7,750,405 | B2 | 7/2010 | Nowak |
| 7,750,682 | B2 | 7/2010 | Bernstein et al. |
| 7,755,144 | B2 | 7/2010 | Li et al. |
| 7,755,146 | B2 | 7/2010 | Helm et al. |
| 7,759,206 | B2 | 7/2010 | Luo et al. |
| 7,759,714 | B2 | 7/2010 | Itoh et al. |
| 7,761,820 | B2 | 7/2010 | Berger et al. |
| 7,795,677 | B2 | 9/2010 | Bangsaruntip et al. |
| 7,808,045 | B2 | 10/2010 | Kawahara et al. |

(56) References Cited

U.S. PATENT DOCUMENTS

| | | |
|---|---|---|
| 7,808,410 B2 | 10/2010 | Kim et al. |
| 7,811,873 B2 | 10/2010 | Mochizuki |
| 7,811,881 B2 | 10/2010 | Cheng et al. |
| 7,816,936 B2 | 10/2010 | Ito |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,859,290 B2 | 12/2010 | Kim |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,031,252 B2 | 10/2011 | Segami et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,067,976 B2 | 11/2011 | Sumita |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,461 B2 | 1/2012 | Chen et al. |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,171,323 B2 | 5/2012 | Rakshani et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,217,712 B2 | 7/2012 | Miyatake et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,293,606 B2 | 10/2012 | Madhavan et al. |
| 8,299,562 B2 | 10/2012 | Li et al. |
| 8,324,059 B2 | 12/2012 | Guo et al. |
| 8,354,671 B1 | 1/2013 | Im et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wiecczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0134394 A1 | 6/2005 | Liu |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | | |
|---|---|---|---|
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | | |
|---|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, 1995, pp. 23-24.
Chau, R et al., "A 50nm Depleted-Substrate CMOS Transistor (DST)", Electron Device Meeting 2001, IEDM Technical Digest, IEEE International, 2001, pp. 29.1.1-29.1.4.
Ducroquet, F et al. "Fully Depleted Silicon-on-Insulator nMOSFETs with Tensile Strained High Carbon Content Si1-yCy Channel", 2006, ECS 210th Meeting, Abstract 1033.
Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.
Goesele, U et al., Diffusion Engineering by Carbon in Silicon, 2000, Mat. Res. Soc. Symp. vol. 610.
Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.
Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.
Holland, OW and Thomas, DK "A Method to Improve Activation of Implanted Dopants in SiC", 2001, Oak Ridge National Laboratory, Oak Ridge, TN.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.
Lavéant, P. "Incorporation, Diffusion and Agglomeration of Carbon in Silicon", 2002, Solid State Phenomena, vols. 82-84, pp. 189-194.
Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.
Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.
Pinacho, R et al., "Carbon in Silicon: Modeling of Diffusion and Clustering Mechanisms", Aug. 2002, Journal of Applied Physics, vol. 92, No. 3, pp. 1582-1588.
Robertson, LS et al., "The Effect of Impurities on Diffusion and Activation of Ion Implanted Boron in Silicon", 2000, Mat. Res. Soc. Symp. vol. 610.
Scholz, R et al., "Carbon-Induced Undersaturation of Silicon Self-Interstitials", Jan. 1998, Appl. Phys. Lett. 72(2), pp. 200-202.
Scholz, RF et al., "The Contribution of Vacancies to Carbon Out-Diffusion in Silicon", Jan. 1999,Appl. Phys. Lett., vol. 74, No. 3, pp. 392-394.
Stolk, PA et al., "Physical Mechanisms of Transient Enhanced Dopant Diffusion in Ion-Implanted Silicon", May 1997, J. Appl. Phys. 81(9), pp. 6031-6050.
Thompson, S et al., "MOS Scaling: Transistor Challenges for the 21st Century", 1998, Intel Technology Journal Q3' 1998, pp. 1-19.
Wann, C. et al., "Channel Profile Optimization and Device Design for Low-Power High-Performance Dynamic-Threshold MOSFET", 1996, IEDM 96, pp. 113-116.
Werner, P. et al., "Carbon Diffusion in Silicon", Oct. 1998, Applied Physics Letters, vol. 73, No. 17, pp. 2465-2467.
Yan, Ran-Hong et al., "Scaling the Si MOSFET: From Bulk to SOI to Bulk", Jul. 1992, IEEE Transactions on Electron Devices, vol. 39, No. 7.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.
Wong, H et al., "Nanoscale CMOS", Proceedings of the IEEE, Vo. 87, No. 4, pp. 537-570.
Machine Translation of KR 10-0794094 Submitted herewith.
Banerjee et al, "Compensating Non-Optical Effects using Electrically-Driven Optical Proximity Correction", Proc. of SPIE, vol. 7275, 2009.
Cheng et al, "Extremely Thin SOI (ETSOI) CMOS with Record Low Variability for Low Power System-on-Chip Applications", IEDM 2009, Dec. 2009.
Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.
Drennan et al., "Implications of Proximity Effects for Analog Design", Custom Integrated Circuits Conference, 2006, CICC '06, IEEE, Sep. 10-13, 2006, pp. 169-176.
Hook et al., "Lateral Ion Implant Straggle and Mask Proximity Effect", IEEE Transactions on Electron Devices, vol. 50, No. 9, Sep. 2003.
Hori et al., "A 0.1 um CMOS with a Step Channel Profile Formed by Ultra High Vacuum CVD and In-Situ Doped Ions", IEDM 1993, May 12, 1993.

(56) References Cited

OTHER PUBLICATIONS

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

Chan et al., "DDRO: A Novel Performance Monitoring Methodology Based on Design-Dependent Ring Oscillators", IEEE International Symposium on Quality Electronic Design, Mar. 9, 2012.

Chen et al., "Fully On-Chip Temperature, Process, and Voltage Sensors", IEEE International Symposium on Circuits and Systems, 2010.

Datta et al., "A 45.6u2 13.4uW 7.1V/V Resolution Sub-Threshold Based Digital Process-Sensing Circuit in 45nm CMOS", GLSVLSI '11, Lausanne, Switzerland, May 2, 2011 to May 4, 2011.

Ghosh et al., "On-Chip Negative Bias Temperature Instability Sensor Using Slew Rate Monitoring Circuitry", IEEE International Symposium on Circuits and Systems, May 24, 2009 to May 27, 2009.

Ghosh et al., "On-Chip Process Variation Detection and Compensation for Parametric Yield Enhancement in sub-100nm CMOS Technology", IEEE International Symposium on Circuits and Systems, IBM Austin Center for Advanced Studies, 2007.

Nan et al., "Dynamic Voltage and Frequency Scaling for Power-Constrained Design using Process Voltage and Temperature Sensor Circuits", Journal of Information Processing Systems, vol. 7, No. 1, Mar. 2011.

Saxena et al., "Variation in Transistor Performance and Leakage in Nanometer-Scale Technologies", IEEE Transactions on Electron Devices, vol. 55, No. 1, Jan. 2008.

Tschanz et al., "Adaptive Body Bias for Reducing Impacts of Die-to-Die and Within-Die Parameter Variations on Microprocessor Frequency and Leakage", IEEE Journal of Solid-State Circuits, vol. 37, No. 11, Nov. 2002.

Zhang et al., "An On-Chip Characterizing System for Within-Die Delay Variation Measurement of Individual Standard Cells in 65-nm CMOS", Design Automation Conference, Jan. 25, 2011 to Jan. 28, 2011.

* cited by examiner

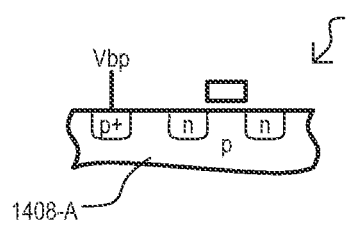
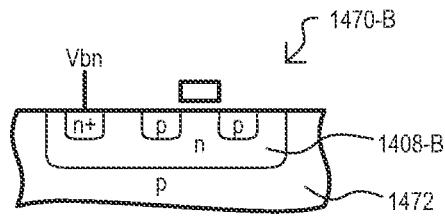
FIG. 14A  FIG. 14B
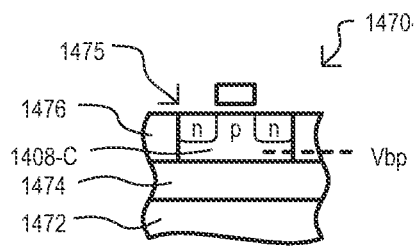
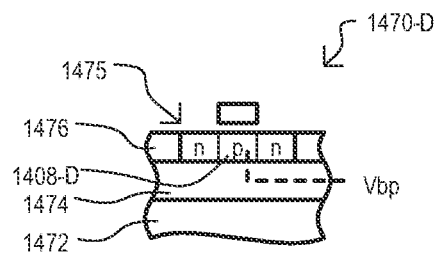
FIG. 14C  FIG. 14D
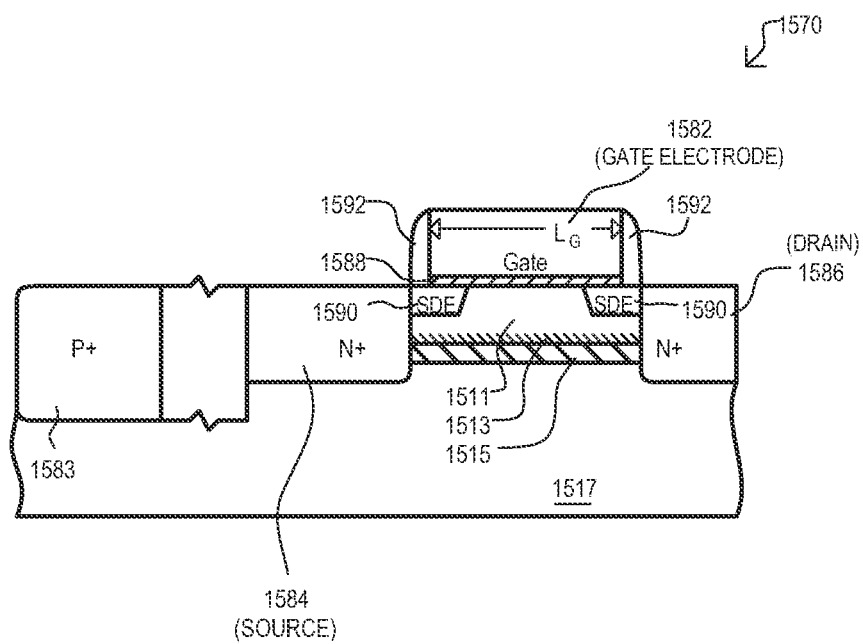
FIG. 15A

BODY BIAS CIRCUITS AND METHODS

CROSS-REFERENCE TO RELATED APPLICATIONS

This application is a divisional of U.S. patent application Ser. No. 13/668,063 filed on Nov. 2, 2012.

TECHNICAL FIELD

The present invention relates generally to integrated circuit (IC) devices, and more particularly to body bias circuits and methods for insulated gate field effect transistors of IC devices.

BACKGROUND

Integrated circuit (IC) devices can be subject to manufacturing variations that can impact performance. In a typical IC device, electrical signals can be transmitted via an interconnect structure formed by multiple metallization layers, separated from one another by interlayer dielectrics (ILDs). Signals can be generated by transistors driving metallization layers between different potentials.

Many fabrication processes utilize chemical-mechanical polishing (CMP) to planarize ILD surfaces. While CMP can improve planarization over other fabrication methods, it can still impart systematic and random thickness variations at the lot, wafer, die and pattern levels. Die level variation in such structures can result in performance and timing differences in the same type of devices. In particular, signal transmission paths can be affected by variations in metal-metal capacitance inherent in an interconnect structure. Differences in metal-metal capacitance can arise from variations in dielectric thickness between metallization lines and/or variations in metal thickness and width. Differences in resistance can also arise from such variations in metal thickness and width.

Active devices (e.g., transistors) may also be subject to some variation in performance. For example, uncontrollable manufacturing variations can result in "fast" transistors and "slow" transistors. Fast transistors can provide faster driving capability than slow transistors. Such fast vs. slow variations can be systematic, i.e., they can affect the mean value of performance parameters.

These and other variations can result in IC devices having differing performance limits. Conventionally, timing paths can be designed with sufficient margin to be adequate for a slowest case. This can require large signal driving devices and increased power consumption, as well as increased design effort. For some very high performance IC devices, such variations can present a limit to device speed and/or reliability.

BRIEF DESCRIPTION OF THE DRAWINGS

FIGS. 14A to 14D are side cross sectional views of devices that can be body biased according to embodiments.

FIG. 15A is a side cross sectional view of a deeply depleted channel (DDC) transistor that can be included in embodiments.

FIGS. 16A-0 to 16B-1 are graphs showing how transistor performance can be measured with a circuit like that of FIG. 4A, and how a body bias can be adjusted to change transistor performance.

DETAILED DESCRIPTION

Figure 1:
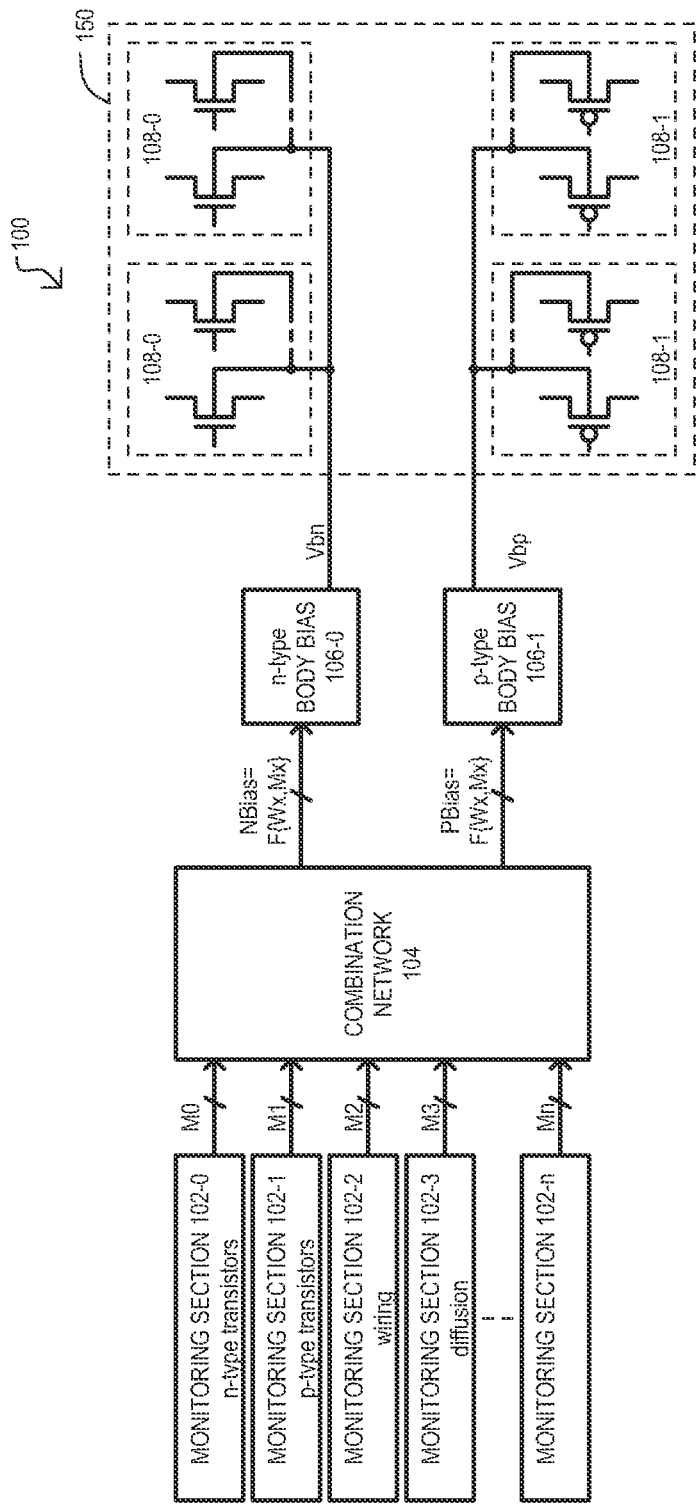
FIG. 1 is a block schematic diagram of an integrated circuit device according to an embodiment.

Various embodiments of the present invention will now be described in detail with reference to a number of drawings. The embodiments show integrated circuits and methods for biasing bodies of transistors in an integrated circuit device, where such biasing can be based on performance of actual circuit structures present on the integrated circuit device.

In the various embodiments below, like items are referred to by the same reference character but the leading digits corresponding to the figure number.

FIG. 1 is a block schematic diagram of an integrated circuit (IC) device 100 according to one embodiment. An IC device 100 can include a number of monitoring sections 102-0 to -n, a combination logic section 104, an n-type body bias circuit 106-0, a p-type body bias circuit 106-1, and an operational section 150. Monitoring sections (102-0 to -n) can include physical structures corresponding to those of the IC device 100.

Each monitoring section (102-0 to -n) can include physical circuit elements of the IC device 100 that can vary according to process variation. Monitoring sections (102-0 to -n) can output monitor values M0 to Mn that reflect variations in performance resulting from variations in process. In particular embodiments, each monitoring section (102-0 to -n) can provide a monitor value (M0 to Mn) that is dominated by one or more particular process features. In the particular embodiment shown, monitor sections (102-0 to -n) include those dominated by: n-type transistor performance, p-type transistor performance, wiring, and diffusion. It is understood that such features are but exemplary. In some embodiments, a monitoring section can include a ring oscillator circuit having an oscillating frequency reflecting the effect of one or more sources of process variations. However, in particular embodiments, a monitoring section can include a transistor drive monitoring section, embodiments of which are described in more detail below.

Monitor sections (102-0 to -n) can provide monitor values in various ways. For example, in some embodiments or modes of operation, monitor sections (102-0 to -n) can be operational during a test or characterization phase. Monitor values (M0 to Mn) generated in the test/characterization phase can be stored such that they remain fixed throughout the operation of the device. After the monitor values have been generated, the combination logic section 104 can access the stored monitor values to set the n-type and p-type transistor body bias voltages based on one or more of the stored monitor values during the operation of the device. The monitor values can be stored in internal storage that is part of the combination logic section 104, or in external storage that is located outside the combination logic section 104 and accessed by the combination logic section 104.

In other embodiments or modes of operation, monitor sections (102-0 to -n) can be activated periodically and/or constantly, allowing monitor values to be updated while the device is in operation. In such embodiments, a combination logic section 104 can receive the periodically or continuously updated monitor values (102-0 to -n) and modify the n-type and p-type body bias voltages based on the updated monitor values.

In still other embodiments or modes of operation, monitor sections (102-0 to -n) can be enabled in response to a command input to the IC device 100, where the monitor sections generate and store updated monitor values during a test/characterization phase that is initiated in response to receiving the command input at the IC device. In other embodiments, the monitor sections (102-0 to -n) can be enabled in response to received status information indicative of particular conditions or changes to particular conditions (e.g., power-on, reset, temperature, power supply voltage, etc.). For example, the test/characterization phase can be initiated if temperature exceeds a predetermined threshold value, such that monitor sections (102-0 to -n) are enabled to generate and store updated monitor values that are used to modify the n-type and p-type body bias voltages.

A combination logic section 104 can receive monitor values (M0 to Mn), and from such values, generates n-type and p-type body bias control values (NBias, PBias). In particular embodiments, a combination logic section 104 can assign different weights to one or more of the monitor values (M0 to Mn) such that particular monitor values (M0 to Mn) have a greater weight over others, to reflect how one type of process variation can have a greater effect than other types of process variations on a particular performance characteristic of a circuit within the IC device 100. In this way, body biases can be tuned to optimize an IC device for a particular performance target. In some embodiments, bias control values (NBias, PBias) can be static during the operation of the IC device 100. However, in other embodiments, such values can be static, changing according to mode of operation, and/or operating conditions. Additionally, the weights can compensate for differing sensitivities of the monitoring circuits to the variations, as well as the IC's sensitivity to such variations.

It is noted that bias control values (NBias, PBias) generated by a combination logic section 104 can be digital or analog values.

An n-type body bias circuit 106-0 can receive a bias control value (NBias), and in response generate an n-channel transistor body bias voltage (Vbn). That is, a voltage Vbn can vary according to the bias control value NBias. In very particular embodiments, Vbn can vary from a "back bias" level (VBB) to a forward bias level (VFB). A back bias level can force a body region below a low power supply voltage (e.g., less than VSS) to increase a threshold voltage, but lower a switching speed of an n-type transistor (as compared to such a transistor having a body bias of VSS). In contrast, a forward bias level can force a body region above a low power supply voltage (e.g., greater than VSS) to lower a threshold voltage of a transistor, but increase a switching speed of an n-type transistor (as compared to such a transistor having a body bias of VSS).

In a similar fashion, a p-type body bias circuit 106-1 can receive a bias control value (PBias), and in response, generate a p-channel transistor body bias voltage (Vbp). In certain embodiments, Vbp can vary from a "back bias" level (e.g., greater than a high power supply voltage VDD) to a "forward bias" level (e.g., less than VDD).

An operational section 150 can include transistors formed with body regions that can receive the body bias voltages (Vbn, Vbp). Such transistors can be arranged to provide a predetermined function as part of different functional blocks having different predetermined target performance characteristics, where the performance of each functional block can be independently adjusted by selection of the n-type and p-type body bias voltages. Accordingly, an operational section 150 can include n-type transistors formed in p-type body regions 108-0, and p-type transistors formed in n-type body regions 108-1. Body regions (108-0/1) can vary according to transistor type. Various examples of transistors that can have a body bias will be described in more detail below.

Body bias voltages (Vbn, Vbp) can be applied to transistors of operational section 150 to compensate for process variations detected by monitoring sections (102-0 to -n). Thus, if a metallization structure presents a high capacitance, resulting in a slower signal transmission speed, a body bias voltage can be lowered, to increase the driving speed of the transistors in the device. Similarly, if such transistors are considered "slow" transistors, a body bias voltage can be reduced or increased, for p-type and n-type transistors respectively, to bring the performance of the transistors back into a desired speed range. The opposite type of adjustment is possible as well. If metallization presents a smaller capacitance or transistors are "fast", a body bias can be increased or decreased to compensate for these variations by corresponding changes of the transistor speeds in response to the applied body bias.

Figure 2:
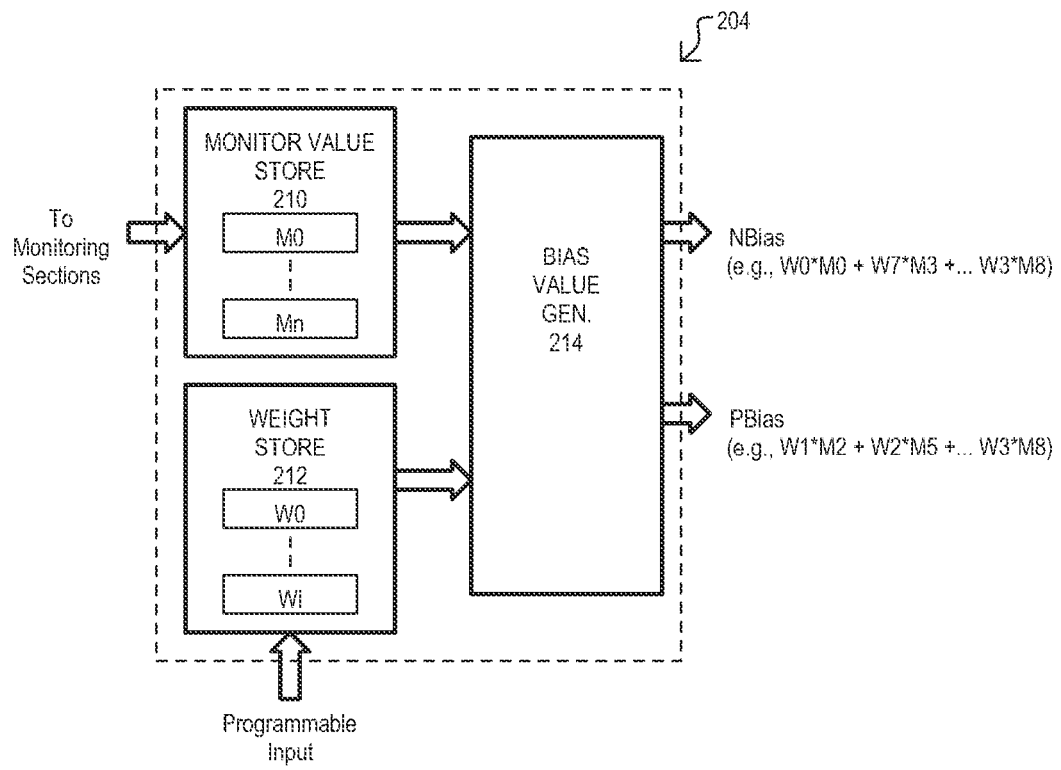
FIG. 2 is a block schematic diagram of a combination logic section according to an embodiment.

FIG. 2 shows a combination logic section 204 according to an embodiment. In one particular embodiment, a combination logic section 204 can be one implementation of that shown as 104 in FIG. 1. A combination logic section 204 can include a monitor value store 210, weight value store 212, and a body bias value generator circuit 214. A monitor value store 210 can store monitor values (Mo to Mn) received from monitor sections (not shown). As noted above, monitor values can be static or dynamic. A monitor value store 210 can be formed with any suitable storage elements, including non-volatile elements, volatile storage elements, or combinations of thereof.

A weight value store 212 can provide weight values (W0 to Wi) to increase or decrease the effect that a monitor value can have on a resulting bias control value (PBias, NBias), typically achieved by multiplying the monitor value by the corresponding weight value. In some embodiments, weight values (W0 to Wi) can be determined through simulation or characterization of circuits within an integrated circuit device. In other embodiments, weight values (W0 to Wi) can be established by testing integrated devices of a same manufacturing group (e.g., lot), or by circuits on the device itself (such as monitor sections, described herein). Once such weight values are determined, the values (W0 to Wn) can remain fixed during the operation of the device, or alternatively, can be updated during the operation of the device. A monitor value store 210 can be formed with any suitable storage elements, including non-volatile elements, volatile storage elements (e.g., flash memory, fuses, SRAM, latches), or combinations of thereof. In the case of fixed weight values, a back end process, such as the opening of fusible links can be used to set the weight values.

A bias value generator circuit 214 can apply weighting values (W0 to Wn) to corresponding monitor values (M0 to Mn), and combine the results to generate bias control values (NBias, PBias) that are responsive to the weighting values (W0 to Wn) and the monitor values (M0 to Mn). A bias value generator circuit 214 can include any circuits suitable for combining/weighting monitor values. In some embodiments, a bias value generator circuit 214 can be an analog circuit, combining/multiplying voltages or currents. In other embodiments, a bias value generator circuit 214 can be a digital circuit, combining digital values through operations such as binary addition and multiplication. In the latter case, a bias value generator circuit 214 can be formed with custom logic, programmable logic, and/or can include a processor executing predetermined instructions.

It is noted that a combination logic section 204 can also modify a bias control value in response to additional control parameters. As but one example, the bias control values (e.g., NBias and/or PBias) can be adjusted according to a power supply voltage of the device. Such one or more of the bias control values can be adjusted by a predetermined amount if a change on the power supply voltage exceeds a threshold value. Such adjustments can be performed by directly modifying the bias control values, modifying the stored monitor values (M0 to Mn), or adjusting the weights (W0 to Wn) in response to received values of the control parameters.

Figure 3:
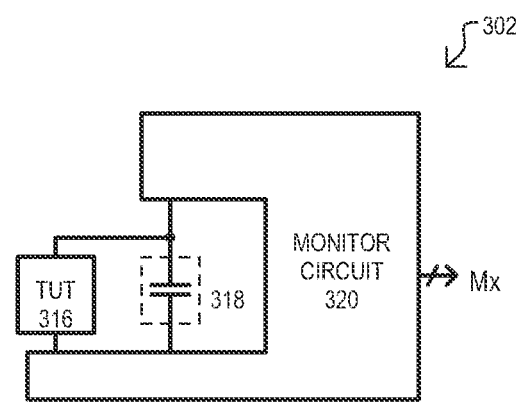
FIG. 3 is a block schematic diagram of a monitoring section that can be included in embodiments.

FIG. 3 shows a drive monitoring circuit 302 according to one embodiment. A drive monitoring circuit 302 can be one of a type of monitor circuit, such as those shown as 102-0 to -n in FIG. 1). A drive monitor circuit 302 can include a transistor-under-test (TUT) section 316, a load section 318, and a monitor section 320. A TUT section 316 can include one or more transistors that can be tested for performance. Such transistors can include n-channel transistors, p-channel transistors, or combinations thereof.

A load section 318 can include an impedance that is driven by TUT section 316 in a monitor operation. In some embodiments, a load section 318 can include circuit elements (e.g., capacitors) formed with physical structures of an IC device, to reflect process variations of such structures.

A monitor section 320 can generate a monitor value Mx reflecting a TUT section 316 driving a load section 318. For example, in embodiments where the load section 318 is a capacitor, the monitor section 320 generates the monitor value Mx by first charging the capacitor to a predetermined first voltage. Typically, the TUT section is configured to be in a non-conductive state while the capacitor is being pre-charged to set a predetermined initial condition prior to the TUT measurement operation. (In certain embodiments, the capacitor can be pre-discharged to set the initial condition. For simplicity we use the terms pre-charged and dis-charged for the setting of the initial conditions and TUT measurement operations, respectively). After the capacitor has been charged to the predetermined first voltage, the monitor section 320 stops charging the capacitor and configures the TUT section 316 to a conductive state such that the capacitor starts discharging to a second predetermined voltage through the TUT section 316. Thus, a drive monitoring circuit 302 can be "dominated" by the performance of transistor(s) in TUT section 316 and/or physical features of an IC device reflected by load section 318. If different TUT sections 316 are used discharge a capacitor that is charged to the same predetermined first voltage, the rate at which the capacitor is discharged through the TUT section 316 represents the speed of the TUT section. Alternatively, if different load sections or different capacitors that are representative of different physical features of the IC device are charged to the same first predetermined voltage, and the same TUT section is used to discharge these load sections, then the rate at which the load section 318 is discharged represents the magnitude of the load resulting from the physical features of the IC device associated with the load section 318. Alternative embodiments of the drive monitoring circuit 302, can first discharge the load section 318 to a first predetermined voltage, and subsequently charge it to a second predetermined voltage through the TUT, where the rate of charging the load section 318 can represent the performance of the load section 318 or the TUT section 316.

Figure 4A:
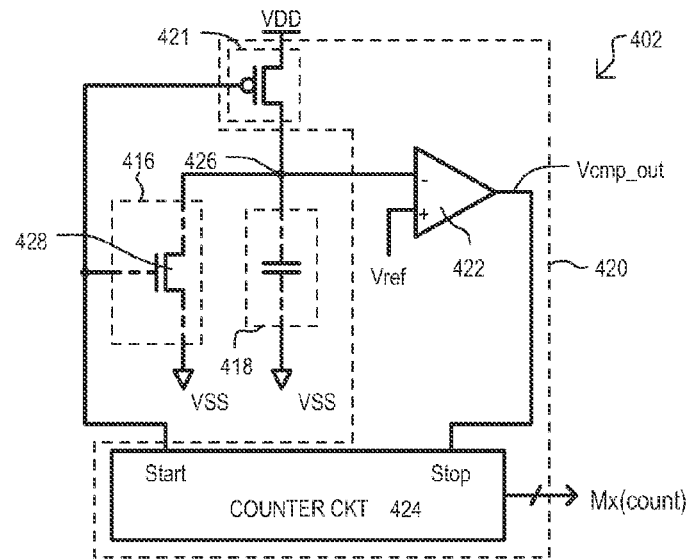
FIGS. 4A and 4B are diagrams showing a monitoring section and operation that can be included in embodiments.

FIG. 4A is a block schematic diagram of a drive monitor circuit 402 according to an embodiment. In one embodiment, a drive monitor circuit 402 can be one particular implementation of that shown in FIG. 3. A drive monitor circuit 402 can include a TUT section 416, composed of an n-channel TUT 428 having a source-drain path connected between a monitor node 426 and a low power supply voltage VSS, and a gate connected to a "Start" signal generated by a counter circuit 424. In a monitor operation, the TUT 416 can discharge monitor node 426 from a predetermined initial voltage to (or toward) VSS, where the time interval to discharge the monitor node to a reference voltage level Vref is representative of the TUT performance.

A load section 418 can be a capacitance, which in the embodiment shown, is connected between monitor node 426 and low power supply voltage VSS. Load section 418 can be charged to a predetermined voltage by monitor circuit 420 through switch element 421, and in a subsequent monitor operation, can be discharged by TUT section 416.

A monitor circuit 420 can include a switch element 421, a comparator 422, and a counter circuit 424. A switch element 421 can charge monitor node 426 to (or toward) VDD in response to a Start output from counter circuit 424. A comparator 422 can have a negative polarity input (labeled "−" in FIG. 4A) connected to monitor node 426, a positive polarity input (labeled "+" in FIG. 4A) that receives a reference voltage Vref, and an output connected to a Stop input of counter circuit 424.

A counter circuit 424 can generate a count value Mx(count) that corresponds (i.e., is inversely proportional) to a speed at which a load section 418 can be discharged by TUT section 416. In particular, counter circuit 424 can start a count operation while simultaneously activating a Start signal. The activated Start signal can start a monitor operation by disabling switch element 421 and enabling TUT section 416, thereby starting the discharge of the load section 418 through the TUT. When an output of comparator 422 goes high, i.e. after the monitor node has discharged to reference voltage Vref, the "Stop" signal is activated and the count operation stops.

Figure 4B:
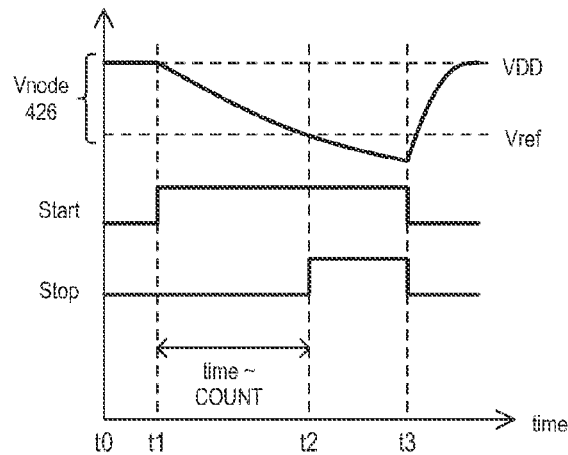

FIG. 4B is a timing diagram showing one particular monitor operation for the drive monitor circuit 402 of FIG. 4A. At time t0, a Start output can be inactive (low). Switch element 421 can be enabled, and monitor node 426 can charge the capacitance of load section 418 to VDD. TUT section 416 can be disabled. With monitor node 426 above a Vref, an output of comparator 422 can be low.

At time t1, a Start output is activated (driven high). Switch element 421 is disabled and TUT section 416 is enabled. As a result, load section 418 starts to discharge toward VSS. At the same time, monitor circuit 420 initiates the count operation. The count operation continues as long as the voltage at the monitor node 426 exceeds the reference voltage Vref, and output of comparator 422 remains low.

At time t2, as the monitor node continues to discharge through TUT section 416 if the voltage at the monitor node 426 falls below Vref. As a result, the comparator 422 transitions to a high voltage level, thereby activating the "Stop" signal and stopping the count operation. The resulting count value after time count operation has stopped is the monitor value Mx(count).

At time t3, a Start output can return to the inactive state. TUT section 416 can be disabled and switch element 421 can be enabled. As a result, monitor node 426 can be pre-charged once again to VDD, and the monitor operation can be repeated.

Figure 5:
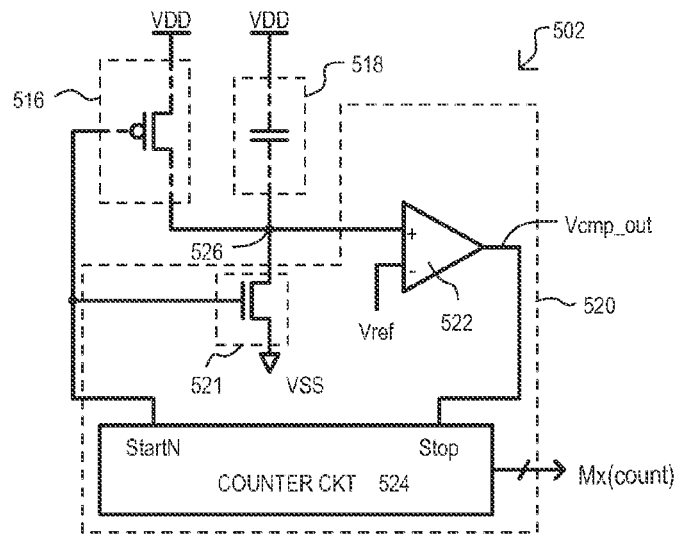
FIG. 5 is a block schematic diagram of another monitoring section that can be included in embodiments.

FIG. 5 is a block schematic diagram of a drive monitor circuit 502 according to another embodiment. The drive monitor circuit 502 can be one particular implementation of that shown in FIG. 3. A drive monitor circuit 502 includes sections corresponding to FIG. 4A, but with reversed transistor conductivity types. Thus, a count value Mx(count) can reflect the performance of a p-channel TUT section 516 and/or load section 518.

Thus, the TUT section 516 of the drive monitor circuit 502 is composed of a p-channel TUT having a source-drain path connected between a monitor node 526 and a high power supply voltage VDD, and a gate connected to a "StartN" signal generated by a counter circuit 524. In a monitor operation, the TUT section 516 can charge the monitor node 526 from a predetermined initial voltage (which is a negative voltage in this embodiment) to (or toward) VDD, where the time interval to charge the monitor node to a reference voltage level Vref is representative of the performance of the TUT section 516.

The load section 518 can be a capacitance, which in the embodiment shown is connected between the monitor node 526 and the high power supply voltage VDD. The monitor circuit 520 can include a switch element 521, a comparator 522, and a counter circuit 524. The "StartN" signal generated by the counter circuit 524 is an active-low signal that starts the monitor operation when it is at a low voltage level. When the "StartN" signal is at a high voltage level, the switch element 521 pre-discharges the monitor node 526 towards VSS, and therefore, the load section 518 is discharged until the voltage across the load section 518 is -VDD (or negative VDD). Subsequently, the counter circuit 524 starts a count operation and simultaneously activates the "StartN" signal by placing a low voltage level on that signal. The activated "StartN" signal starts the monitor operation by disabling switch element 521 and enabling the TUT section 516, thereby starting to charge the load section 518 through the TUT section 516. The charging of the load section continues either as long as the "StartN" signal is asserted, or until the monitor node voltage reaches VDD (i.e., the load section 518 has been charged such that the voltage across the load section 518 increases from -VSS to VDD). As the monitor node voltage increases from VSS towards VDD, the output of the comparator 522 goes high after the monitor node voltage exceeds the reference voltage Vref. This activates the "Stop" signal and stops the count operation of the counter circuit 524. The resulting count value after the count operation has stopped is the monitor value Mx(count).

Figure 6A:
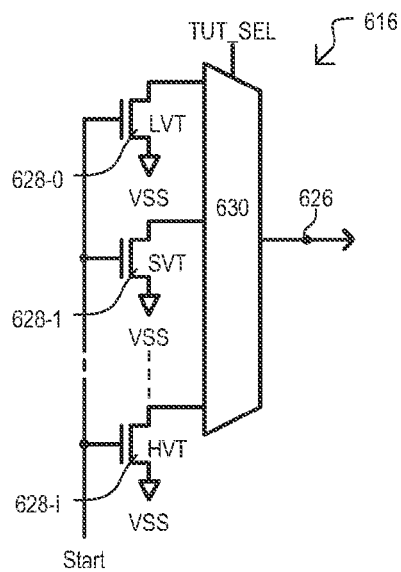
FIG. 6A is a block schematic diagram of a transistor under test (TUT) selection circuit that can be included in embodiments.

An IC can have different transistor types, sizes, etc. comprising those on the critical timing paths, so it can be useful to monitor multiple devices by having corresponding TUTs. These multiple TUTs can have individual loads or may share loads. FIG. 6A is a block schematic diagram of a TUT section 616 that can be included in embodiments. TUT section 616 can be one particular implementation of that shown as 416 in FIG. 4). A TUT section 616 can select one of multiple transistors (628-0 to -i) for a monitoring operation.

A TUT section 616 can include multiple TUTs (628-0 to -i) and a multiplexer (MUX) 630. In response to select inputs TUT_SEL, one of TUTs (628-0 to -i) can be connected to monitor node 626. In the particular embodiment shown, TUTs can include a low threshold voltage transistor (LVT), a standard threshold voltage transistor (SVT) (which is slower than LVT transistors), and a high threshold voltage transistor (HVT) (which is slower than both SVT and LVT transistors). However, in other embodiments, TUTs can include transistors having other differences (e.g., doping profiles, width/length ratios, oxide thicknesses, etc.). Also, while FIG. 6A shows n-channel device, other embodiments can include p-channel transistors.

A MUX 630 can be formed from the same device types as corresponding TUTs (i.e., n-channel, p-channel). That is, a charge/discharge path flows through a transistor(s) having a same conductivity type. In other embodiments, a MUX 630 can include signal paths formed by complementary conductivity (e.g., CMOS) devices, which can introduce substantially no threshold voltage drop into the charge/discharge path. Regardless, the conductivity of the MUX should be much greater than that of the TUT so that the result is not significantly impacted. Alternatively, the weights and Vref on the comparator can be adjusted so that the measurement results properly represents the TUT and load combination.

Switching in different TUT types can enable a monitor value to represent the performance of such a transistor type.

Figure 6B:
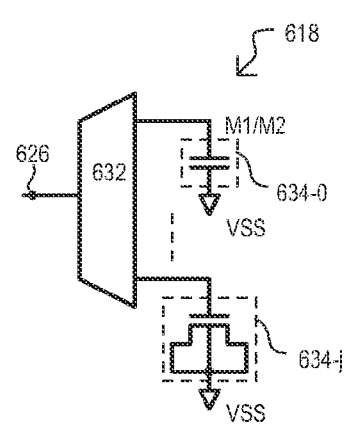
FIG. 6B is a block schematic diagram of a load capacitance selection circuit that can be included in embodiments.

FIG. 6B is a block schematic diagram of a load section 6718 that can be included in embodiments. Load section 618 can be one particular implementation of that shown as 418 in FIG. 4A or 518 in FIG. 5). A load section 618 can select one of multiple loads (634-0 to -j) for a monitoring operation.

A load section 618 can include multiple loads (634-0 to -j) and a multiplexer (MUX) 632. In response to select inputs Z_SEL, one of loads (634-0 to -j) can be connected to monitor node 626. In the particular embodiment shown, loads can include capacitors formed by various structures of an IC device, and hence can reflect process variations of the device. In FIG. 6, one capacitance 634-0 can be a metal-metal capacitor having one plate formed by a metallization layer(s), a second plate formed by metallization layer(s), and a dielectric formed by one or more interlayer dielectric(s). In contrast, another capacitance 634-j can be a transistor capacitance having one plate formed by a transistor gate, a second plate formed by a substrate (source/drain/channel), and a dielectric formed by a gate capacitance and diffusion capacitance.

However, in other embodiments, loads (634-0 to -j) can include other impedance types, or combinations of impedances, such as resistance, inductance, etc.

Switching in different load types can enable a monitor value to represent the delay caused by the capacitance presented by such a load type. Additionally, in the presence of systemic variation of the IC, the monitor value can also represent the performance impact resulting from such variations.

Figure 7:
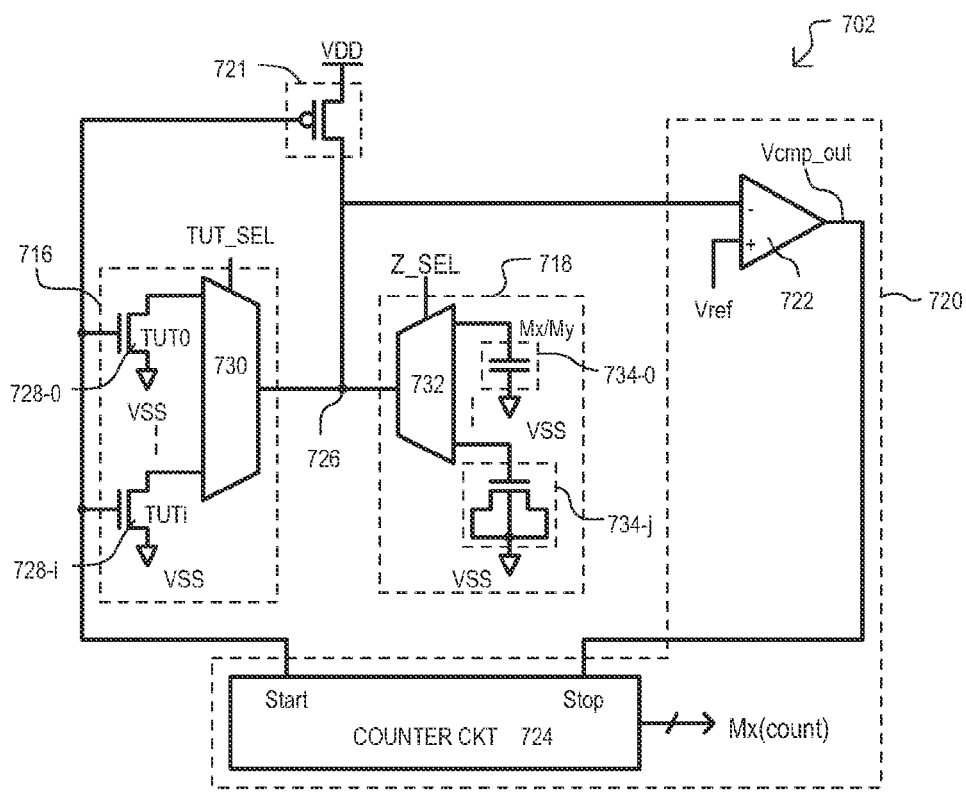
FIG. 7 is a block schematic diagram of a drive monitor circuit according to another embodiment.

FIG. 7 is a block schematic diagram of a drive monitor circuit 702 according to another embodiment. In one embodiment, a drive monitor circuit 702 can be one particular implementation of that shown in FIG. 3. A drive monitor circuit 702 can include sections like those of FIG. 4A, including a TUT section 716 and a load section 718.

However, unlike FIG. 4A, a TUT section 716 can take a form like that of FIG. 6A, enable the selection of any of a number of different TUTs 728-0 to 728-i. While FIG. 7 shows a TUT section 716 with n-channel TUTs, TUT section 716 can include p-channel TUTs as well. A MUX 730 can selectively connect one or more TUTs (728-0 to 728-i) to monitor node 726. Similarly, a load section 718 can take the form of that shown in FIG. 6B, enabling the selection of any of a number of different loads 734-0 to 734-j.

Accordingly, in operation, a drive monitor circuit 702 can evaluate circuit element performance by executing different monitor operations, as described herein or equivalents, that select different combinations of TUTs (728-0 to 728-i) with different loads (734-0 to 734-j). It is understood that such different monitor operations can select a single TUT and a single load, multiple TUTs and a single load, a single TUT and multiple loads, as multiple TUTs with multiple loads.

For example, in embodiments where the load section 718 includes a capacitor, the monitor section 720 can evaluate the performance of one or more transistors included in the TUT section 716 by performing a monitor operation for each of the transistors while setting the select input Z_SEL to connect the same capacitor of the load section 718 to the monitor node 726. During each monitor operation the monitor section 720 selects one of the TUTs of the TUT section 716 using the TUT_SEL input (e.g., TUT0, . . . , TUTi) and generates the monitor value Mx for the selected TUT by first charging the load section 718 to a predetermined first voltage. Typically, the TUT section 716 is configured to be in a non-conductive state while the load section 718 is being charged. After the load section 718 has been charged to VDD, the monitor operation is started by asserting the "Start" signal of the counter circuit 724 and simultaneously starting the count operation of the counter circuit 724. This stops the charging of the load section 718 and configures the selected TUT of the TUT section 716 to a conductive state such that the load section 718 starts discharging to VSS through the selected TUT. This discharging of the load section 718 continues either as long as the "Start" signal is asserted, or until the monitor node voltage reaches VSS (i.e., the load section 718 has been discharged such that the voltage across the load section 718 decreases from VDD to VSS). As the monitor node voltage decreases from VDD towards VSS, the output of the comparator 722 goes high after the monitor node 726 voltage goes below the reference voltage Vref. This activates the "Stop" signal and stops the count operation of the counter circuit 724. The resulting count value after the count operation has stopped is the monitor value Mx(count). After the monitor value for the selected TUT has been completed, the performance of additional TUTs in the TUT section are evaluated by charging the load section 718 to VDD, setting TUT_SEL input to a value that selects the next TUT of the TUT section 716 that is to be evaluated, and performing another monitor operation by activating the start signal to obtain the monitor value Mx for the next TUT. This process can be repeated to obtain the monitor value for additional TUTs in the TUT section 718.

Alternatively, the monitor circuit 702 can evaluate the performance impact resulting from different process variations and physical features of the IC device by performing the monitor operation for corresponding loads of the load section 718, e.g. 734-0 . . . j, under the control of the load select signal Z_SEL, while using the same TUT section to discharge the selected load section, then the rate at which the selected load section is discharged represents the performance impact of the load resulting from the process variation or physical feature of the IC device associated with the selected load. The value of the load select signal Z_SEL can be changed to select additional loads in the load section 718, and the steps for charging the monitor node 726 and subsequently discharging it using the same TUT section can be repeated to evaluate the performance impact of additional sources of process variation or physical features of the ID device.

Figure 8:
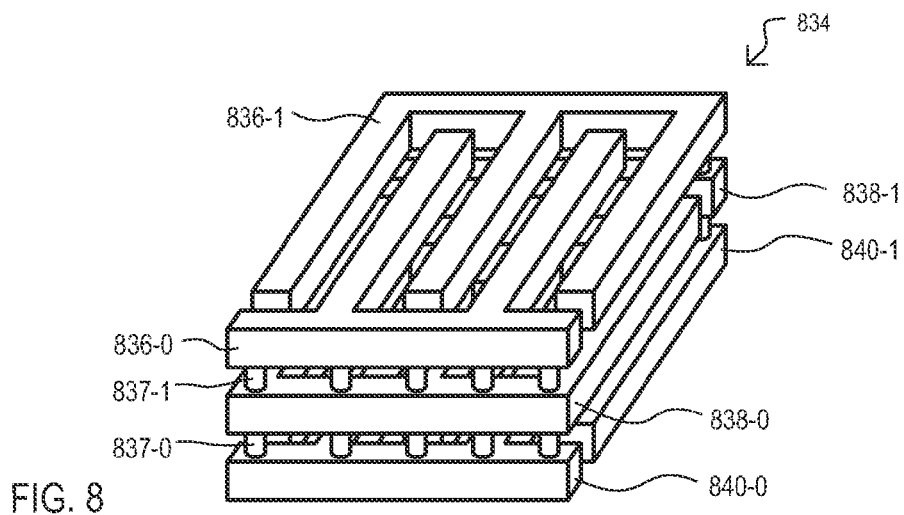
FIG. 8 is a diagram of a metal-metal capacitor that can be included in embodiments.

FIG. 8 is a diagram showing one particular example of a metal-metal (M-M) capacitor 834 that can be included in embodiments. M-M capacitor 843 can include plate members formed by interdigitated metallization layers. Plate members 840-0/1 can be formed by a lower metallization layer. Plate members 838-0/1 formed by another metallization layer formed over members 840-0/1. Plate members 836-0/1 formed by another metallization layer formed over members 838-0/1. One plate of M-M capacitor 834 can be formed by members 836-0/838-0/840-0 conductively connected together by vertical interconnects 837-0/1. Another plate of M-M capacitor 834 can be formed by members 836-1/838-1/840-1 conductively connected together by vertical interconnects 837-0/1. Such M-M capacitors can be readily designed to match the IC timing paths, e.g., having the same line to line spacing on the same layers, as well as the requisite crossing widths and orientations so as to mimic signal lines on the IC.

Other M-M capacitors can be formed with single interdigitated metallization layer, to monitor a capacitance arising from lateral separation of wirings. Similarly, other M-M capacitors can be formed by vertically stacked metallization layers, to monitor a capacitance arising from vertical separation of wirings.

Figure 9:
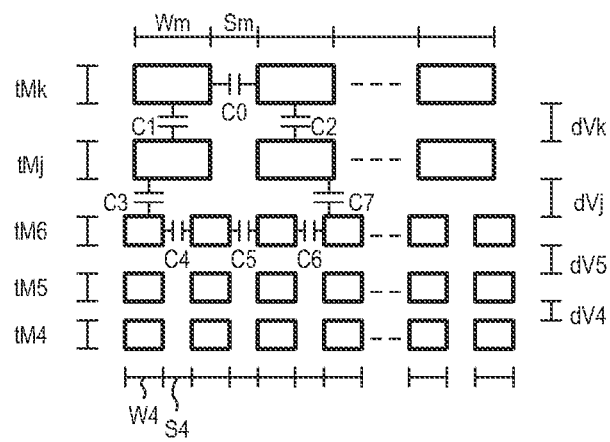
FIG. 9 is a diagram showing capacitance corresponding to metallization fabrication variations.

FIG. 9 is a diagram showing how differences in conductive layers can introduce variations in capacitance. FIG. 9 shows different conductive layers in relation to one another. Metallization layers can have different vertical thickness (e.g., tM4, tM5, tM6 . . . tMj, tMk), different horizontal widths (e.g., W4 . . . Wm), different vertical separation (dV4, dV5 . . . dVj, dVk) created by interlayer dielectrics, and different lateral separation (pitch) (e.g., S4 . . . Sm).

A capacitance between such layers (partially represented by capacitances C0 to C7) can vary according to process variation. Accordingly, by including capacitors formed by combinations of metallization layers as load elements in monitoring sections, the effect of such processes variation can be compensated for, to optimize circuit performance.

Figure 10:
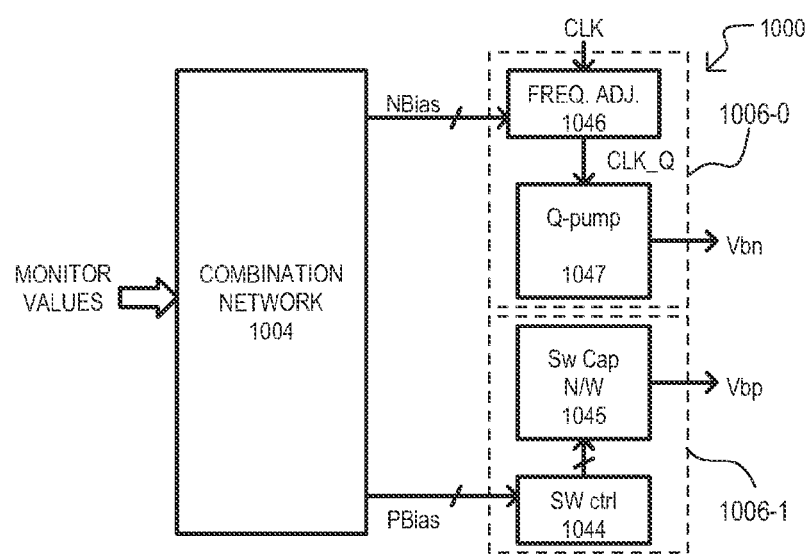
FIG. 10 is a block schematic diagram of an integrated circuit device according to an embodiment.

FIG. 10 is a block schematic diagram of an IC device 1000 according to one embodiment. An IC device 1000 can be one particular implementation of that shown as 100 in FIG. 1. An IC device 1000 can include a combination logic section 1004, an n-type body bias circuit 1006-0, a p-type body bias circuit 1006-1, and monitoring sections (not shown) that provide monitoring values to combination logic section 1004.

In the embodiment shown, an n-type body bias circuit 1006-0 can include a charge pump 1047 and a frequency adjust (frequency control) circuit 1046. A charge pump 1047 can drive its output Vbn to a potential based on a clock signal CLK_Q. Frequency adjust circuit 1046 can generate clock signal CLK_Q according to bias control values NBias, which can be generated as described for embodiments herein, or equivalents. Thus, to increase a magnitude of Vbn (i.e., drive Vbn to a lower potential), an NBias value can cause frequency adjust circuit 1046 to increase the frequency of CLK_Q. Conversely, to decrease a magnitude of Vbn (i.e., drive Vbn to a higher potential), an NBias value can cause frequency adjust circuit 1046 to decrease the frequency of CLK_Q.

In the embodiment shown, a p-type body bias circuit 1006-1 can include a switched capacitor network 1045 and a switch control circuit 1044. A switched capacitor network 1045 can drive its output Vbp to a potential based on a switch control network 1044. Switch control network 1044 can generate control signals based on bias control values PBias, which can be generated as described for embodiments herein, or equivalents.

Body bias circuits as described herein, can generate forward body bias voltages VFB and reverse body bias voltages VBB. In particular embodiments, a forward body bias voltage can be generated by creating a voltage offset from a generated body bias voltage. One such embodiment is shown in FIG. 11.

Figure 11:
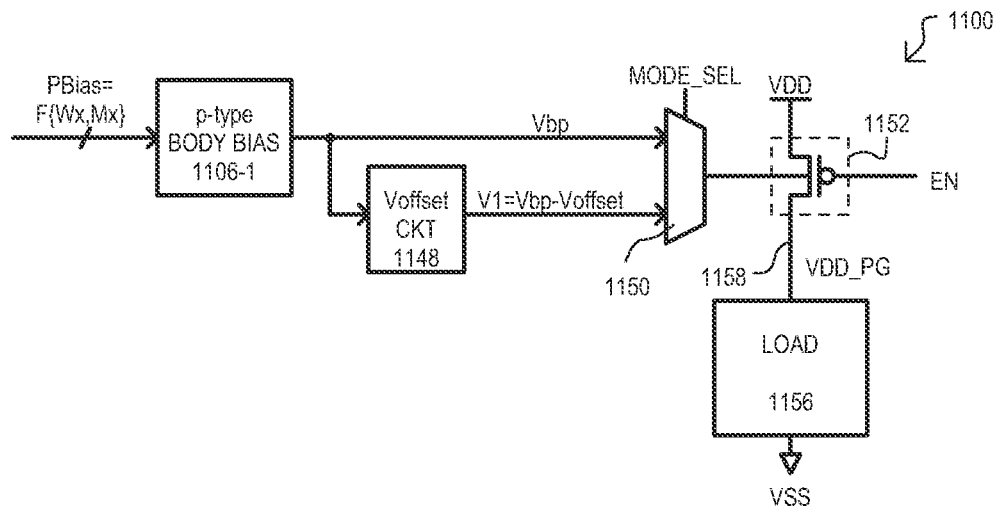
FIG. 11 is a block schematic diagram of a power gating circuit according to an embodiment.

FIG. 11 is a block schematic diagram of a power switching circuit 1100 according to an embodiment. A power switching circuit 1100 can include a p-type body bias circuit 1106-1, a voltage offset circuit 1148, a mode select MUX 1150, a power switching device 1152, and a load section 1156. A power switching circuit 1100 can provide a low impedance power supply path to a load 1156 that can vary according to mode of operation.

A p-type body bias circuit 1106-1 can generate a body bias voltage Vbp based on bias control values PBias. Bias control values PBias can be generated according to weighted monitor values, as described herein. That is, PBias can be a function of one or more monitor values (Mx) weighted by one or more weight values (Wx). In one particular embodiment, a body bias voltage Vbp can be a reverse body bias voltage VRB that can increase a threshold voltage and decrease leakage of a p-channel transistor.

A voltage offset circuit 1148 can generate a voltage having a predetermined offset with respect to a received voltage. In some embodiments, an offset can be a voltage lower than a received voltage. In the embodiment shown, voltage offset circuit 1148 can generate a voltage V1, where V1=Vbp−Voffset. V1 can be a forward body bias voltage VFB. In one particular embodiment, a voltage offset circuit can be a Widlar voltage source circuit, but any suitable offset circuit can be employed.

A mode select MUX 1150 can selectively apply either Vbp or V1 as a body bias voltage for power switching device 1152. In one mode (e.g., an active or high performance mode), mode select MUX 1150 can apply V1 as a body bias voltage, to lower a threshold voltage of a switching device 1152. In a second mode (e.g., an inactive or low leakage mode), mode select MUX 1150 can apply Vbp as a body bias voltage, to increase a threshold voltage of a switching device 1152.

A switching device 1152 can be one or more p-channel transistors having a body connected to an output of mode select MUX 1150, a source connected to a high power supply VDD, a drain connected to an internal power supply node 1158, and a gate connected to receive an enable signal EN. By operation of switching device 1152, a voltage VDD_PG can be generated at internal power supply node 1158, to provide power to load section 1156.

A load section 1156 can be connected between internal power supply node 1158 and a low power supply VSS. In some embodiments, a load section 1156 can include a circuit that provides some predetermined function for the IC device containing the power switching circuit 1100.

Figure 12:
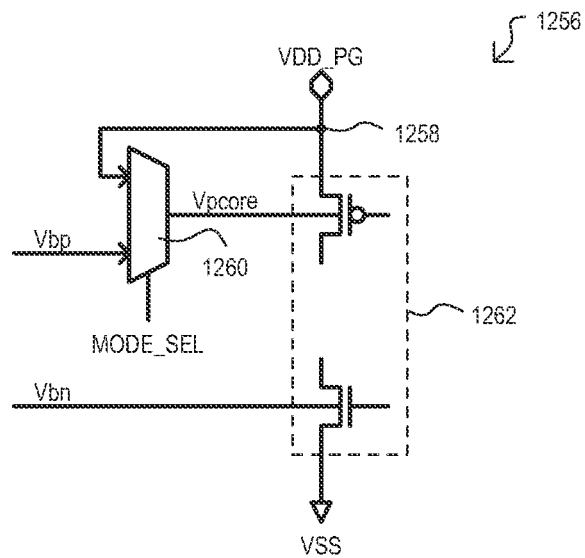
FIG. 12 is a block schematic diagram of a core biasing circuit that can be used in an embodiment like that of FIG. 11.

FIG. 12 is a block schematic diagram of a core biasing circuit 1256 that can be used in an embodiment like that of FIG. 11. In one embodiment, core biasing circuit 1256 can correspond to load section 1156 of FIG. 11. A core biasing circuit 1256 can include a "core" section 1262 and a core bias MUX 1260.

A core section 1262 can perform a predetermined function, and can include complementary (i.e., p-channel and n-channel) transistors, having bodies that receive adjustable body bias voltages (Vpcore, Vbn). A core section 1262 can be formed between an internal power supply node 1258 VDD_PG and a low power supply node VSS. In one embodiment, an internal power supply node 1258 VDD_PG can correspond to that shown as 1158 in FIG. 11 (i.e., it can be switched between a high body bias Vbp and a lower VFB of V1). In the embodiment shown, n-channel transistors of core section 1262 can have bodies biased to a voltage Vbn. A voltage Vbn can be a generated according to embodiments shown herein, or equivalents. Bodies of p-channel transistors of core section 1262 can be biased according to an output from core bias MUX 1260.

Core bias MUX 1260 can selectively apply either a body bias voltage Vbp or the voltage at internal power supply node VDD_PG (which can be less than Vbp), according to a mode value MODE_SEL. More particularly, in one mode (e.g., an active or high performance mode), core bias MUX 1260 can apply VDD_PG as a body bias voltage. In a second mode (e.g., an inactive or low leakage mode), core bias MUX 1260 can apply Vbp as a body bias voltage. Such a local switching of the p-channel wells of core section 1262 can reduce band to band tunneling junction current when a switching device (i.e., 1152 of FIG. 11) is off, and VDD_PG can be at a relatively low voltage.

In some embodiments, body biasing, as described for a power gating switch in FIG. 11, can also be applied to a device that supplies a regulated voltage. One such embodiment is shown in FIG. 13.

Figure 13:
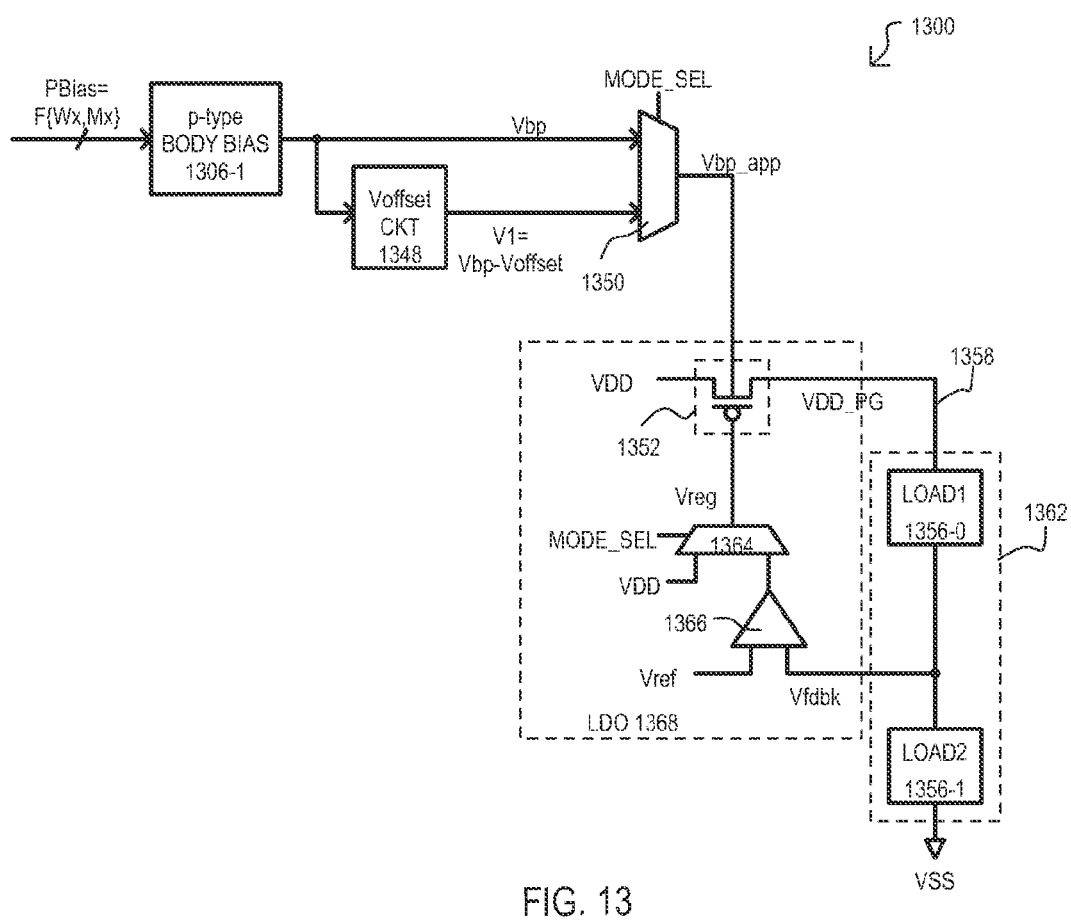
FIG. 13 is a block schematic diagram of a regulator circuit according to an embodiment.

FIG. 13 is a block schematic diagram of a regulator circuit according to an embodiment. A regulator circuit 1300 can include sections like those of FIG. 11, including a p-type body bias circuit 1306-1, a voltage offset circuit 1348, and a mode select MUX 1350. Such like sections can operating in the same fashion as those shown in FIG. 11, or equivalents.

A voltage regulating circuit 1300 can also include a low dropout regulator (LDO) section 1368 and core section 1362. An LDO section 1368 can include a regulating device 1352, a mode control MUX 1364, and an amplifier 1366. A regulating device 1352 can be a p-channel transistor having a body connected to an output of mode select MUX 1350, a source connected to a high power supply VDD, a drain connected to a regulated node 1358, and a gate connected to receive a regulation control voltage Vreg, output from mode control MUX 1364.

A mode control MUX 1364 can selectively output either a high power supply voltage VDD or an output of amplifier 1366. In one mode (e.g., a regulated mode), mode control MUX 1364 can apply the output of amplifier 1366, which can drive a gate of regulating device 1352 to maintain regulated node 1358 at a predetermined voltage. In a second mode (e.g., an inactive or low leakage mode), mode control MUX 1364 can apply VDD as a body bias voltage, to turn off regulating device 1352.

An amplifier 1366 can provide an output that can vary according to a feedback voltage Vfdbk provided from core section 1362. Thus, if a voltage at regulated node 1358 is too low, Vfdbk can fall below Vref, and an output of amplifier 1366 can be driven lower. Conversely, if a voltage at regulated node 1358 is too high, Vfdbk can rise above Vref, and an output of amplifier 1366 can be driven higher.

A core section 1362 is represented by load sections 1356-0 and 1356-1. It is understood that such sections (1356-0/1) can represent circuits for performing the various functions of an IC device.

Body biasing as described for embodiments herein can be applied to bodies of various transistor types. Examples of some transistor types which can receive a body bias voltage are shown in FIG. 14A to 15.

FIG. 14A shows a bulk substrate n-channel transistor 1470-A, in which a transistor body can be biased via a bulk substrate 1408-A. FIG. 14B shows a p-channel transistor 1470-B formed in an n-type well, formed in a p-type substrate. In such a transistor, a body can be biased via well 1408-B.

FIGS. 14C and 14D show a semiconductor-on-insulator type transistor (e.g., silicon-on-insulator, SOI) having an active semiconductor region 1475 separated in a vertical direction from a bulk substrate 1472 by an insulating layer 1474. Active region 1475 can be separated in a lateral direction from other active regions (not shown) by lateral insulating structures 1476.

FIG. 14C shows an n-channel transistor 1470-C having source and drain regions that do not extend to insulating layer 1474. A body region can be biased via body region 1408-C. FIG. 14D shows an n-channel transistor 1470-C having source and drain regions that extend to insulating layer 1474. A body region can be biased via body region 1408-D.

FIG. 15A shows a deeply depleted channel (DDC) type transistor 1570, which can be included in embodiments. A DDC transistor 1570 can be configured to have an enhanced body coefficient, along with the ability to set a threshold voltage (Vt) with enhanced precision. A DDC transistor 1570 can include a gate electrode 1582, source 1584, drain 1586, and a gate dielectric 1588 positioned over a substantially undoped channel 1511. Optional lightly doped source and drain extensions (SDE) 1590 can be positioned respectively adjacent to source 1584 and drain 1586. Such extensions 1590 can extend toward each other, reducing effective length of the substantially undoped channel 1511.

In FIG. 15A, the DDC transistor 1570 is shown as an n-channel transistor having a source 1584 and drain 1586 made of n-type dopant material, formed upon a substrate such as a p-type doped silicon substrate providing a p-well 1517. In addition, the n-channel DDC transistor 1570 in FIG. 15A can include a highly doped screening region 1515 made of p-type dopant material, and a threshold voltage set region 1513 made of p-type dopant material.

Figure 15B:
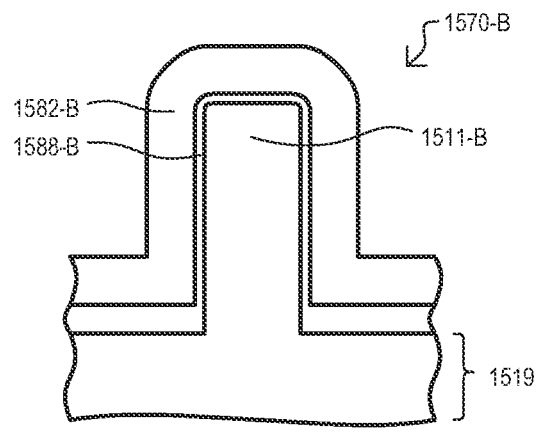
FIG. 15B is a side cross sectional view of FinFET transistor that can be included in embodiments.

FIG. 15B shows FinFET type transistor 1570-B which can be included in embodiments. The FinFET transistor 1570-B can include a gate electrode 1582-B and gate dielectric 1588-B that surround a substantially undoped channel 1511-B on opposing sides. The view of FIG. 15B is taken along a channel length. Thus, it is understood that source and drain regions can extend into and out of the view shown. Further, such source and drain regions can be separated from screening region 1515-B by portions of undoped channel region 1511-B.

Figure 15C:
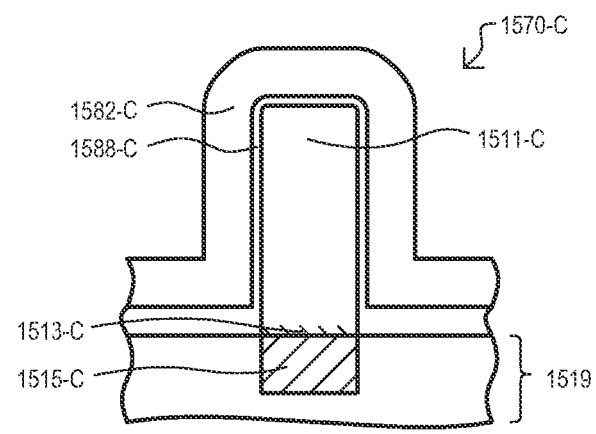
FIG. 15C is a side cross sectional views of FinFET transistor having a screening region, and optionally, a threshold voltage set region, that can be included in embodiments.

FIG. 15C shows a FinFET type transistor 1570-C having a screening region 1515-C which can be included in embodiments. As in the case of FIG. 15A, the FinFET transistor 1570-C having a screening region can be configured to have an enhanced body coefficient, along with the ability to set a Vt with enhanced precision. The transistor 1570-C includes a gate electrode 1582-C and gate dielectric 1588-C formed over a substantially undoped channel 1511-C on opposing sides. However, unlike FIG. 15B, a highly doped screening region 1515-C is formed in a substrate 1519 below substantially undoped channel 1511-C. Optionally, a Vt set region 1513-C is formed between the screening region 1515-C substantially undoped channel 1511-C.

As in the case of FIG. 15B, the view of FIG. 15C is taken along a channel length, and source and drain regions can extend into and out of the view, separated from screening region 1515-C by portions of undoped channel region 1511-C.

Embodiments of various structures and manufacturing processes suitable for use in DDC transistors are disclosed in U.S. patent application Ser. No. 12/708,497, filed on Feb. 18, 2010, titled Electronic Devices and Systems, and Methods for Making and Using the Same, by Scott E. Thompson et al.; U.S. Pat. No. 8,273,617, issued on Sep. 25, 2012, titled Low Power Semiconductor Transistor Structure and Method of Fabrication Thereof; U.S. patent application Ser. No. 12/971,955 filed on Dec. 17, 2010 titled Transistor with Threshold Voltage Set Notch and Method of Fabrication Thereof; U.S. patent application Ser. No. 12/895,785 filed on Sep. 30, 2010 titled "Advanced Transistors With Threshold Voltage Set Dopant Structures"; and U.S. patent application Ser. No. 13/071,399 filed on Mar. 24, 2011, titled "Analog Circuits Having Improved Transistors, and Method Therefor", by Lawrence T. Clark et al; the disclosures of which are hereby incorporated by reference in their entirety. In addition, methods and structures for modifying the threshold voltage of DDC transistors are discussed in pending U.S. patent application Ser. No. 13/459,971 titled "Multiple Transistor Types Formed in a Common Epitaxial Layer by Differential Out-diffusion from a Doped Underlayer", filed Apr. 30, 2012, the entirety of which disclosure is incorporated by reference herein.

It is understood that, with appropriate change to substrate or dopant material, conductivities of any of the transistors described above can be switched (i.e., from p-channel to n-channel and vice versa).

Having described various circuit features, methods of monitoring and adjusting transistor performance will now be described.

Figures 0, 16A:
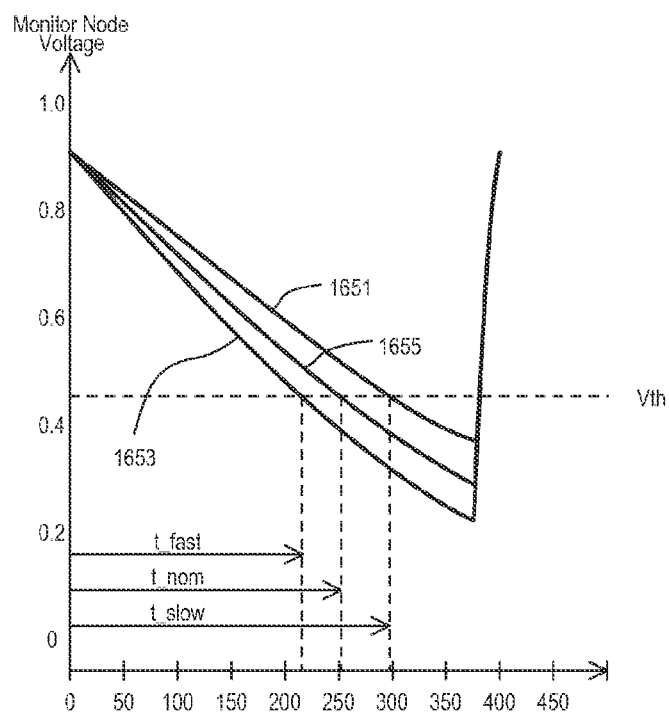
Figures 1, 16A:
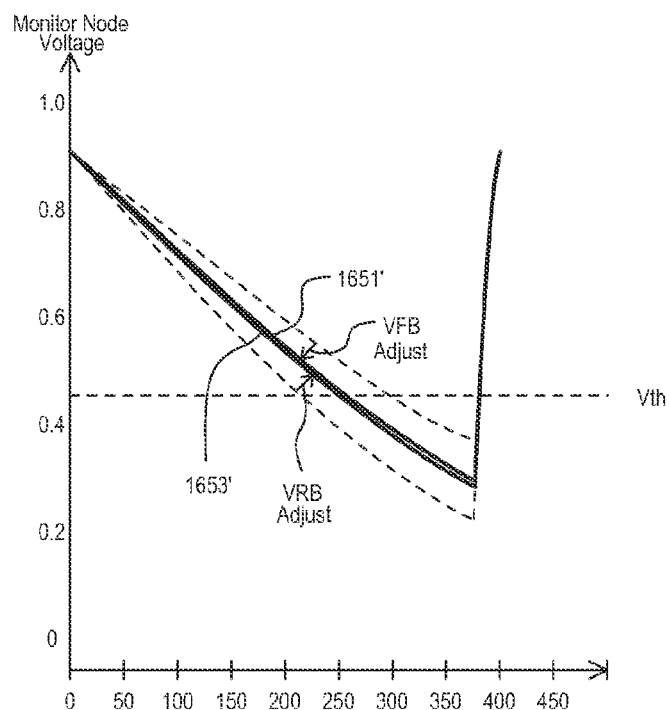

FIG. 16A-0 is a graph showing performance variations of n-channel TUTs in a circuit like that of FIG. 4A. Curve 1651 shows transistor performance for a "slow" n-channel TUT. Curve 1653 shows transistor performance for a "fast" n-channel TUT. Curve 1655 shows a nominal transistor performance for an n-channel TUT. The n-channel TUTs of FIG. 16A-0 are DDC transistors like that shown in FIG. 15, having a reverse body bias voltage of 0.3V, and source-drain voltage (VDS) of 0.9V. A monitor circuit can determine the performance of the TUT by determining the duration of time taken by a monitor node voltage to dis-charge from an initial voltage level to a predetermined voltage level. For example, in the embodiment shown in the figure, the monitor circuit determines three different performance levels for the TUT (shown as t_fast, t_nom, and t_slow) by determining the time (e.g. count) at which the voltage at the monitor node falls below 0.44V.

FIG. 16A-1 is a graph showing how an adjustment of a body bias can compensate for variations in transistor performance. Curve 1651' shows a "slow" n-channel device performance after the body bias has been adjusted in the forward body bias direction to 0.04V. As shown, after such an adjustment, the slow n-channel transistor can closely follow the nominal case 1655. Similarly, curve 1653' shows a "fast" n-channel device performance after the body bias has been adjusted in the reverse body bias direction to 0.46V. As shown, after such an adjustment, the fast n-channel transistor now closely follows the nominal case 1655.

Figures 0, 16B:
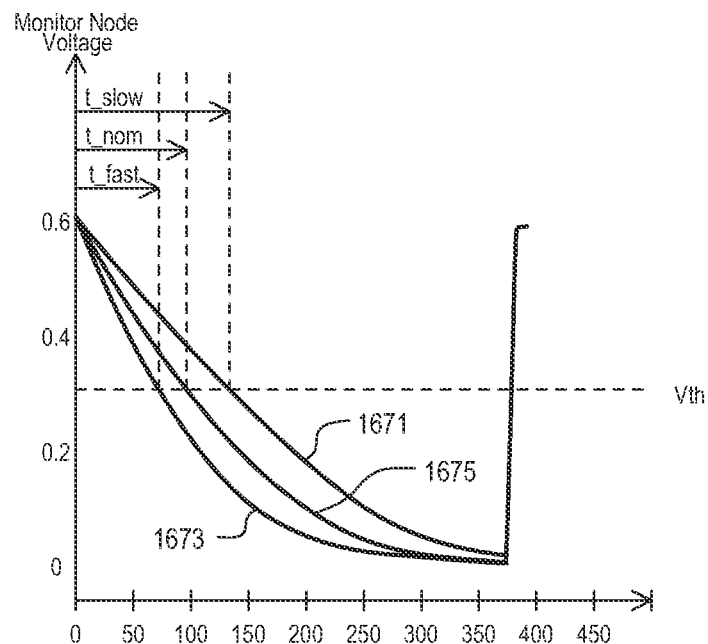
Figures 1, 16B:
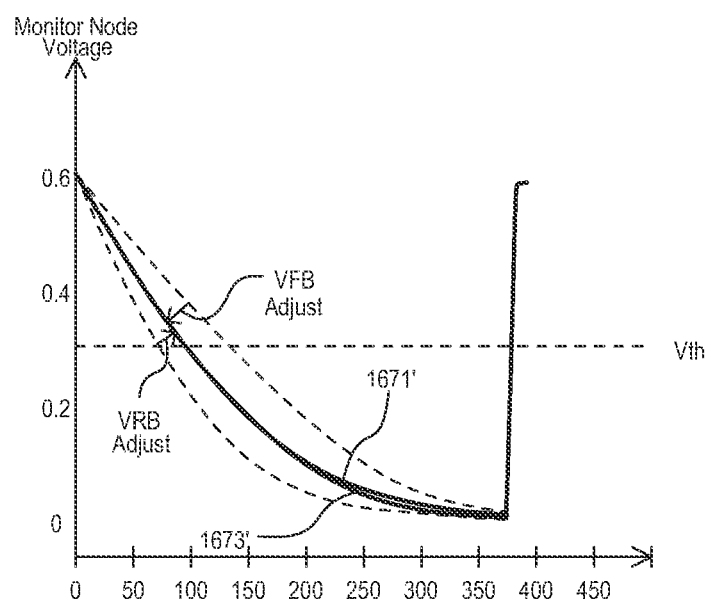

FIG. 16B-0 is a graph showing performance n-channel TUTs like that of FIG. 16A-0, but at a lower source-drain voltage (VDS) of 0.6V, and a capacitive load that is 20% of that used for FIG. 16A-0. Like FIG. 16A-0, curve 1671 shows transistor performance for a slow n-channel TUT, curve 1673 shows transistor performance for a fast n-channel TUT, curve 1675 shows a nominal transistor performance for an n-channel TUT. Speeds of transistors can are based on the time (e.g., count) when a monitor node falls below 0.3V (shown again as t_fast, t_nom, and t_slow).

FIG. 16B-1 shows how adjustment of a body bias can compensate for variations in transistor performance in the same manner as FIG. 16A-1 (but with different body bias adjustments).

Accordingly, according to monitor results, a body bias voltage can be adjusted to bring a transistor performance within a desired limit. Thus, if devices are manufactured having different transistor performance, such difference can be detected by monitoring circuits, and a body bias adjusted to enable the devices to have similar or substantially identical performance to the nominal case. Thus the IC can have its systematic variability compensated towards the nominal IC performance, thereby limiting IC non-uniformity due to manufacturing variations.

Figure 17:
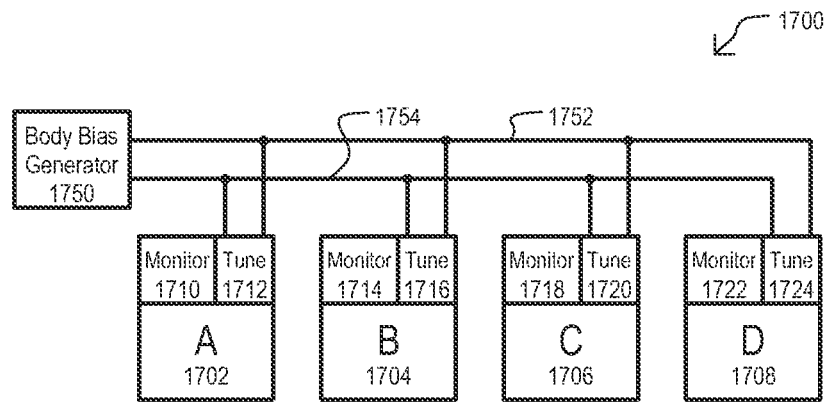
FIG. 17 shows one embodiment of a bias voltage distribution network using monitor circuits to implement a fine grained body biasing technique.

The monitor circuit embodiments described above can be used to implement a fine grained body biasing scheme, where the body bias voltages used for individual functional blocks or different regions of the integrated circuit can be independently adjusted to compensate for local variations (e.g., process, temperature, or voltage variations) across the integrated circuit. FIG. 17 shows one embodiment of a bias voltage distribution network that uses monitor circuits to implement a fine grained body biasing technique. FIG. 17 shows an integrated circuit 1700, with four functional blocks 1702, 1704, 1706, and 1708. Functional block 1702 includes a monitor circuit 1710 and a body bias tuning circuit 1712, functional block 1704 includes a monitor circuit 1714 and a body bias tuning circuit 1716, functional block 1706 includes a monitor circuit 1718 and a body bias tuning circuit 1720, and functional block 1708 includes a monitor circuit 1722 and body bias tuning circuit 1724. The functional blocks 1702-1708 can be SRAM arrays having different sizes or different performance targets, graphics processors, general purpose processors, memory controllers, etc. In addition, the design of one or more of the functional blocks 1702-1708 can be the same as one of the other functional blocks on the integrated circuit, where the different identically designed functional blocks are configured to operate at different performance targets (e.g., speed, power consumption, etc.) by the application of different body bias voltages. In alternative embodiments, the integrated circuit 1700 can be divided into several regions, instead of functional blocks where each region has a monitor circuit and a body bias tuning circuit.

The integrated circuit 1700 uses one body bias generator 1750 that generates a pmos body bias voltage and an nmos body bias voltage sufficient to provide the highest body bias voltage that is to be supplied to the p-channel and n-channel transistors, respectively, of the functional blocks in the integrated circuit 1700. The nmos and pmos body bias voltages generated by the body bias generator 1750 are distributed to the functional blocks 1702-1708 using wires 1752 and 1754, respectively. The body bias tuning circuit at each functional block, receives the body bias voltages on the wires 1752 and 1754, and generates local pmos and nmos body bias voltages for the corresponding functional block in accordance with the body bias control signal received from the monitor circuit of that functional block. In alternative embodiments, where only one body bias voltage is required (e.g., only the nmos or pmos transistors are back biased), the body bias generator 1750 can generate only one body bias voltage, and only one wire can be used to distribute that body bias voltage to the functional blocks in the integrated circuit.

Figure 18:
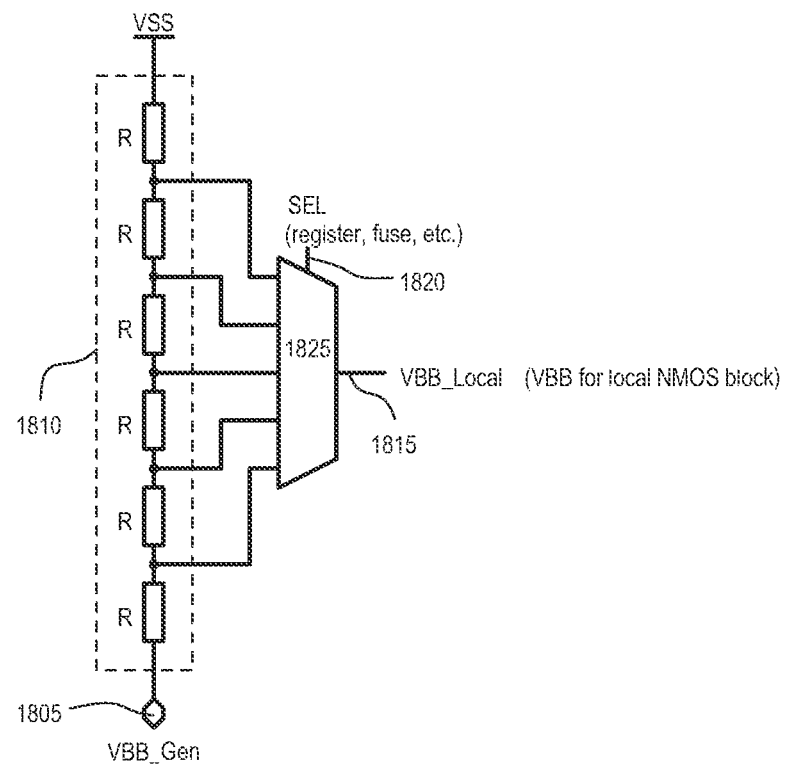
FIG. 18 shows one embodiment of the bias tuning circuit using a resistive divider to generate the local body bias voltage.

FIG. 18 shows one embodiment of the bias tuning circuit using a resistive divider 1805 to generate the local body bias voltage 1815. In the embodiment shown, the voltage 1810 is received from the body bias generator, and different body bias voltages are generated using the resistive divider 1805. The number of resistors (R) and the values of the resistors in the resistive divider are determined in accordance with the different body bias voltages to be provided to the corresponding functional block. A switch network 1825 receives the voltages generated by the resistive divider and connects the generated voltage selected by the bias voltage select signal 1820 to the local body bias voltage terminal 1815. The body bias voltage select signal is received from the monitor circuit of the functional block.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit, comprising:
   an operational section comprising transistors formed in first and second body regions, and configured to provide predetermined functions;
   at least one first body bias circuit coupled to drive first body regions to a first bias voltage in response to at least first bias values;
   at least one second body bias circuit coupled to drive second body regions to a second bias voltage in response to at least second bias values;
   a plurality of monitoring sections formed in a same substrate as the operational section, each configured to output a monitor value reflecting a different process variation effect on circuit performance, at least one monitoring section including a drive monitoring circuit having
      at least one transistor under test (TUT) having a source coupled to a first power supply node, a gate coupled to receive a start indication, and a drain coupled to a monitor node,
      at least one monitor capacitance coupled to the monitor node, and a timing circuit configured to generate a monitor value corresponding to a rate at which the TUT can transfer current between the monitor node and the first power supply node; and a combination logic section configured to generate the first and second bias values by weighting and combining the monitor values.

2. The integrated circuit of claim 1, wherein:
the operational section includes
the first body regions are doped to a p-type conductivity,
the second body regions are doped to an n-type conductivity, and
the transistors of the operational section include n-type insulated gate field effect transistors formed in the first body regions, and p-type insulated gate field effect transistors formed in the second body regions.

3. The integrated circuit of claim 1, wherein:
at least a portion of the transistors of the operational section are deeply depleted channel transistors having a substantially undoped channel formed over a screening region, the screening region being doped to a higher concentration than portions of the body region formed below the screening region.

4. The integrated circuit of claim 3, wherein the screening region has a dopant concentration range of about $5 \times 10^{18}$ to $1 \times 10^{20}$ atoms/cm$^3$.

5. The integrated circuit of claim 1, wherein:
each monitoring section further includes
a switch element coupled between the monitor node and a second power supply node,
a comparator having a first input coupled to the monitor node, a second input coupled to receive a reference voltage, and an output coupled to the timing circuit, and
the timing circuit is configured to start a count operation in response to disabling the switch element and enabling the TUT, and to stop the count operation in response to the output of the comparator.

6. The integrated circuit of claim 1, wherein:
each monitoring section further includes
a capacitor multiplexing circuit, coupled between the monitor node and a plurality of monitor capacitors, to selectively connect at least one of the monitor capacitors to the monitor node; wherein
the monitor capacitors are formed from different structures of the integrated circuit.

7. The integrated circuit of claim 6, wherein:
the monitor capacitors include
at least one metal capacitor formed from metallization layers of the integrated circuit and an interlayer dielectric between the metallization layers, and
at least one transistor capacitor formed from at least one transistor of the integrated circuit.

8. The integrated circuit of claim 1, wherein:
each drive monitoring section further includes
a TUT multiplexing circuit, coupled between the monitor node and a plurality of TUTs, to selectively connect the drain of one TUT to the monitor node.

9. The integrated circuit of claim 8, wherein:
the plurality of TUTs include
at least one standard voltage transistor fabricated to operate in a first voltage range, and
at least one different voltage transistor fabricated to operate in a different voltage range than the standard voltage transistor.

10. An integrated circuit, comprising:
a plurality of drive monitoring sections, each including
at least one transistor under test (TUT) having a source coupled to a first power supply node, a gate coupled to receive a start indication, and a drain coupled to a monitor node,
at least one monitor capacitor coupled to the monitor node, and
a timing circuit configured to generate a monitor value corresponding to a rate at which the TUT can transfer current between the monitor node and the first power supply node; and
a body bias circuit configured to apply a body bias voltage to at least one body region in which at least one transistor is formed; wherein
the body bias voltage is generated in response to at least a plurality of the monitor values.

11. The integrated circuit of claim 10, wherein:
the plurality of drive monitoring sections includes
at least one n-type drive monitoring circuit having a n-type conductivity TUT, and
at least one p-type drive monitoring circuit having a p-type conductivity TUT.

12. The integrated circuit of claim 10, wherein:
each drive monitoring section further includes
a switch element coupled between the monitor node and a second power supply node,
a comparator having a first input coupled to the monitor node, a second input coupled to receive a reference voltage, and an output coupled to the timing circuit, and
the timing circuit is configured to start a count operation in response to disabling the switch element and enabling the TUT, and to stop the count operation in response to the output of the comparator.

13. The integrated circuit of claim 10, further including:
a combination logic section coupled to receive the monitor values and configured to generate bias values by weighting and combining the monitor values; and
the body bias voltage varies according to at least one bias value.

14. The integrated circuit of claim 10, wherein:
the at least one body region is selected from: a substrate of a first conductivity type; a well of a second conductivity type formed in a substrate of a first conductivity type; an active semiconductor region formed over an insulating layer that includes a semiconductor-on-insulator type transistor; and a substrate region formed below a screening region doped to a higher conductivity type than the substrate region, the screening region being formed below a substantially undoped channel region of a transistor.

15. The integrated circuit of claim 10, wherein:
the at least one transistor comprises a deeply depleted channel transistor having a substantially undoped channel formed over highly doped screening region to provide a strong body coefficient.

16. The integrated circuit of claim 15, wherein the screening region has a dopant concentration range of about $5 \times 10^{18}$ to $1 \times 10^{20}$ atoms/cm$^3$.

* * * * *